(12) United States Patent
Suzuki

(10) Patent No.: US 11,763,904 B2
(45) Date of Patent: Sep. 19, 2023

(54) METHOD OF ADJUSTING OPERATING CONDITIONS FOR SEMICONDUCTOR MEMORY DEVICE

(71) Applicant: Kioxia Corporation, Minato-ku (JP)

(72) Inventor: Shinji Suzuki, Sagamihara (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 17/983,459

(22) Filed: Nov. 9, 2022

(65) Prior Publication Data

US 2023/0069683 A1 Mar. 2, 2023

Related U.S. Application Data

(63) Continuation of application No. 17/197,541, filed on Mar. 10, 2021, now Pat. No. 11,532,368.

(30) Foreign Application Priority Data

Aug. 21, 2020 (JP) ................................. 2020-139918

(51) Int. Cl.
| | | |
|---|---|---|
| *G11C 16/34* | (2006.01) | |
| *G11C 16/10* | (2006.01) | |
| *G11C 16/24* | (2006.01) | |
| *G11C 16/32* | (2006.01) | |
| *G11C 16/30* | (2006.01) | |
| *G11C 16/26* | (2006.01) | |

(52) U.S. Cl.
CPC .......... *G11C 16/3459* (2013.01); *G11C 16/10* (2013.01); *G11C 16/24* (2013.01); *G11C 16/26* (2013.01); *G11C 16/30* (2013.01); *G11C 16/32* (2013.01)

(58) Field of Classification Search
CPC ..... G11C 16/3459; G11C 16/10; G11C 16/24; G11C 16/26; G11C 16/30; G11C 16/32; G11C 16/08; G11C 11/5628; G11C 16/0483
USPC ........................................ 365/185.22, 185.24
See application file for complete search history.

(56) References Cited

U.S. PATENT DOCUMENTS

| | | |
|---|---|---|
| 6,894,931 B2 | 5/2005 | Yaegashi |
| 7,054,195 B2 | 5/2006 | Matsunaga |
| 9,165,659 B1 | 10/2015 | Pang |
| 9,792,991 B1 | 10/2017 | Toriyama |
| 10,510,413 B1 | 12/2019 | Diep |

(Continued)

*Primary Examiner* — Michael T Tran
(74) *Attorney, Agent, or Firm* — Oblon, McClelland, Maier & Neustadt, L.L.P.

(57) ABSTRACT

A method of adjusting operating conditions includes: a substrate; first conductive layers; a first semiconductor layers facing the first conductive layers; a second semiconductor layer connected to the first semiconductor layers; and an electric charge accumulating layer disposed between the first conductive layers and the first semiconductor layers. At a predetermined timing of a program operation, the second conductive layer which is one of the first conductive layers is supplied with a program voltage or a write pass voltage. The method executes: a first operation that supplies the second conductive layer with the write pass voltage and supplies a third conductive layer which is one of the plurality of first conductive layers with the program voltage; and a second operation that supplies the second conductive layer with a verify voltage and supplies the third conductive layer with a voltage.

19 Claims, 26 Drawing Sheets

(56) References Cited

U.S. PATENT DOCUMENTS

| | | | |
|---|---|---|---|
| 2005/0105359 A1 | 5/2005 | Matsunaga | |
| 2006/0203547 A1* | 9/2006 | Takeuchi | G11C 16/26 365/185.09 |
| 2009/0073763 A1* | 3/2009 | Hosono | G11C 11/5642 365/185.17 |
| 2011/0261064 A1* | 10/2011 | Gold | G11C 11/413 711/149 |
| 2011/0299340 A1* | 12/2011 | Samachisa | G11C 13/0069 365/185.21 |
| 2012/0147650 A1* | 6/2012 | Samachisa | H10B 43/20 257/E21.645 |
| 2012/0163096 A1* | 6/2012 | Futatsuyama | G11C 16/0483 365/185.2 |
| 2012/0170373 A1 | 7/2012 | Kim | |
| 2012/0326239 A1* | 12/2012 | Sasaki | H10B 10/125 257/E27.098 |
| 2013/0077404 A1* | 3/2013 | Nawata | G11C 16/3454 365/185.17 |
| 2014/0025866 A1 | 1/2014 | Kim | |
| 2014/0043911 A1* | 2/2014 | Samachisa | G11C 13/003 365/185.18 |
| 2014/0140137 A1 | 5/2014 | Kon Do | |
| 2014/0241068 A1 | 8/2014 | Izumida | |
| 2014/0369124 A1* | 12/2014 | Moon | G11C 16/16 365/185.11 |
| 2015/0049551 A1* | 2/2015 | Sawamura | G11C 16/0483 365/185.17 |
| 2015/0063036 A1 | 3/2015 | Kamigaichi | |
| 2015/0145952 A1* | 5/2015 | Hirata | G03B 17/561 348/38 |
| 2015/0262679 A1 | 9/2015 | Shimura | |
| 2015/0262682 A1 | 9/2015 | Futatsuyama | |
| 2016/0071580 A1 | 3/2016 | Takahashi | |
| 2016/0260484 A1 | 9/2016 | Lim | |
| 2017/0162273 A1* | 6/2017 | You | G06F 12/0253 |
| 2017/0263631 A1 | 9/2017 | Fujiki et al. | |
| 2017/0337969 A1 | 11/2017 | Shikata | |
| 2018/0158528 A1 | 6/2018 | Lee | |
| 2019/0088302 A1 | 3/2019 | Shimomura | |
| 2019/0214395 A1 | 7/2019 | Zhang | |
| 2019/0392908 A1 | 12/2019 | Lee | |
| 2020/0006379 A1 | 1/2020 | Nishikawa | |
| 2020/0126997 A1* | 4/2020 | Hsu | H01L 21/823807 |
| 2020/0210067 A1* | 7/2020 | Cariello | G11C 16/10 |
| 2020/0258993 A1* | 8/2020 | Haraguchi | G11C 29/50012 |
| 2020/0273500 A1 | 8/2020 | Takada | |
| 2020/0273530 A1* | 8/2020 | Shimura | G11C 16/08 |
| 2020/0294594 A1* | 9/2020 | Kimura | G11C 16/26 |
| 2020/0321058 A1 | 10/2020 | Lee | |
| 2021/0065815 A1 | 3/2021 | Lee | |
| 2021/0272617 A1* | 9/2021 | Kang | G11C 16/3459 |
| 2023/0085776 A1* | 3/2023 | Bassa | G11C 7/1048 365/189.05 |
| 2023/0102668 A1* | 3/2023 | Yang | G11C 16/3418 365/185.02 |
| 2023/0120352 A1* | 4/2023 | Lien | G11C 16/26 365/185.22 |
| 2023/0134907 A1* | 5/2023 | Lee | G11C 16/0483 365/185.11 |

* cited by examiner

METHOD OF ADJUSTING OPERATING CONDITIONS FOR SEMICONDUCTOR MEMORY DEVICE

CROSS-REFERENCE TO RELATED APPLICATIONS

This application is a continuation of and claims the benefit of priority under 35 U.S.C. § 120 from U.S. application Ser. No. 17/197,541 filed Mar. 10, 2021, and claims the benefit of priority under 35 U.S.C. § 119 from Japanese Patent Application No. 2020-139918 filed Aug. 21, 2020, the entire contents of each of which are incorporated herein by reference.

BACKGROUND

Field

Embodiments described herein relate generally to a method of adjusting operating conditions for a semiconductor memory device.

Description of the Related Art

There is known a semiconductor memory device that includes a substrate, a plurality of first conductive layers arranged in a first direction intersecting with a surface of the substrate, a plurality of first semiconductor layers that extend in the first direction and face the plurality of first conductive layers, a second semiconductor layer that is separated from the substrate in the first direction, or is a part of the substrate and is connected to one end portions of the plurality of first semiconductor layers in the first direction, an electric charge accumulating layer disposed between the plurality of first conductive layers and the plurality of first semiconductor layers.

DETAILED DESCRIPTION

Figure 1:
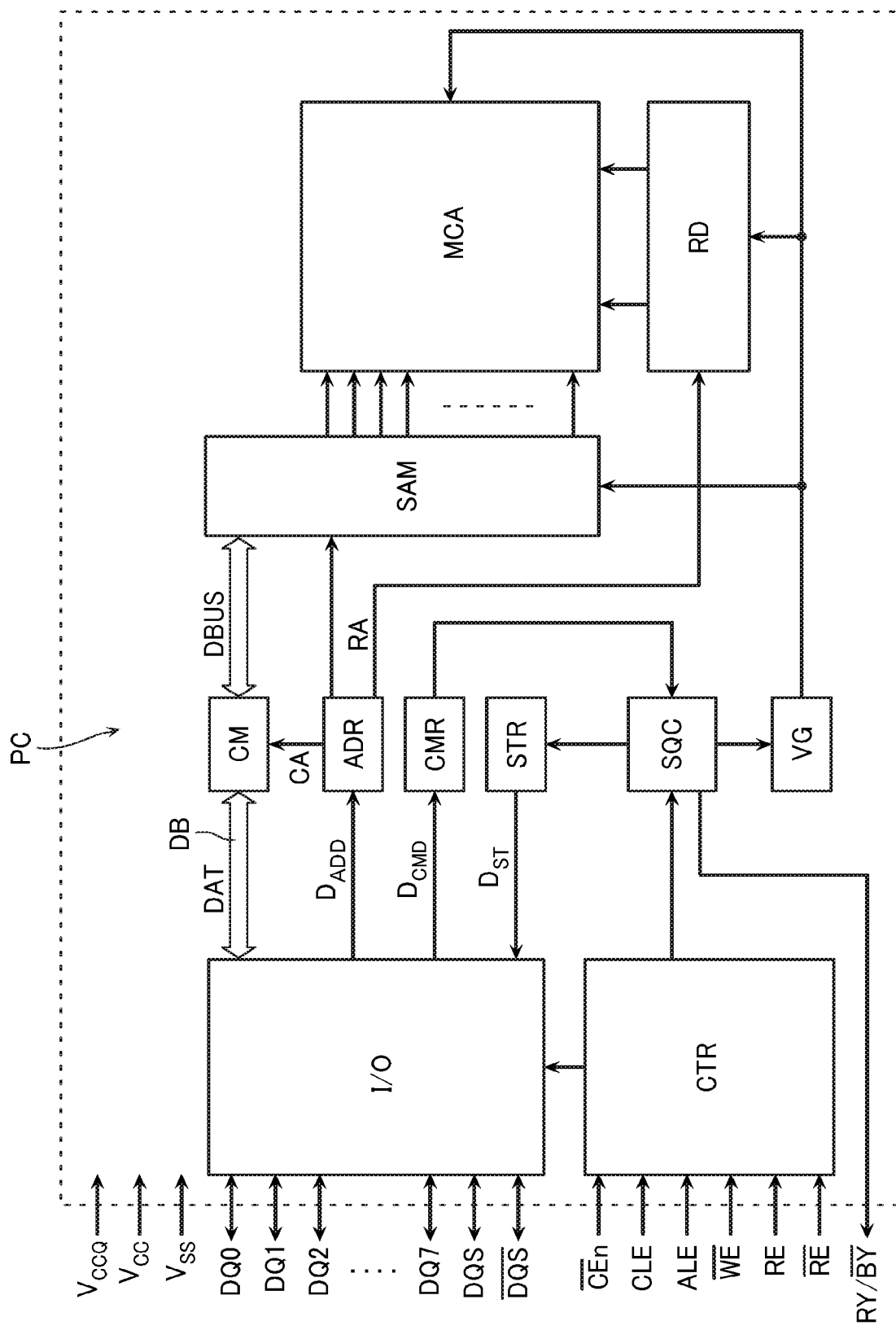
FIG. 1 is a schematic block diagram illustrating a configuration of a semiconductor memory device according to a first embodiment.

In a method of adjusting operating conditions for a semiconductor memory device according to one embodiment, the semiconductor memory device includes: a substrate; a plurality of first conductive layers arranged in a first direction intersecting with a surface of the substrate; a plurality of first semiconductor layers that extend in the first direction and face the plurality of first conductive layers; a second semiconductor layer that is separated from the substrate in the first direction and is connected to one end portions of the plurality of first semiconductor layers in the first direction; and an electric charge accumulating layer disposed between the plurality of first conductive layers and the plurality of first semiconductor layers. At a predetermined timing of a program operation, the second conductive layer which is one of the plurality of first conductive layers is supplied with a program voltage or a write pass voltage smaller than the program voltage. The method executes: a first operation that supplies the second conductive layer with the write pass voltage and supplies a third conductive layer which is one of the plurality of first conductive layers with the program voltage; and a second operation that supplies the second conductive layer with a verify voltage smaller than the write pass voltage and supplies the third conductive layer with a voltage smaller than the program voltage.

Next, the semiconductor memory device according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to "semiconductor memory device", it may mean a memory die and may mean a memory system including a controller die, such as a memory chip, a memory card, and a Solid State Drive (SSD). Further, it may mean a configuration including a host computer such as a smartphone, a tablet terminal, and a personal computer.

In this specification, when referring to "control circuit", it may mean a peripheral circuit such as a sequencer disposed on a memory die and may mean a controller die, a controller chip, or the like connected to a memory die. Further, it may mean a configuration including both of them.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in an OFF state, the first transistor is "electrically connected" to the third transistor.

In this specification, when referring to that the first configuration "is connected between" the second configuration and a third configuration, it may mean that the first configuration, the second configuration, and the third configuration are connected in series and the second configuration is connected to the third configuration via the first configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like is turned ON.

In this specification, a direction parallel to an upper surface of a substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may correspond to any of the X-direction, the Y-direction, and the Z-direction and need not to correspond to these directions.

In this specification, expressions such as "above" and "below" are based on the substrate. For example, a direction away from the substrate along the Z-direction is referred to as above and a direction approaching the substrate along the Z-direction is referred to as below. A lower surface and a lower end of a certain configuration mean a surface and an end portion on the substrate side of this configuration. A top surface and an upper end of a certain configuration mean a surface and an end portion on a side opposite to the substrate of this configuration. A surface intersecting with the X-direction or the Y-direction is referred to as a side surface and the like.

First Embodiment

[Circuit Configuration of Semiconductor Memory Device]

Figure 2:
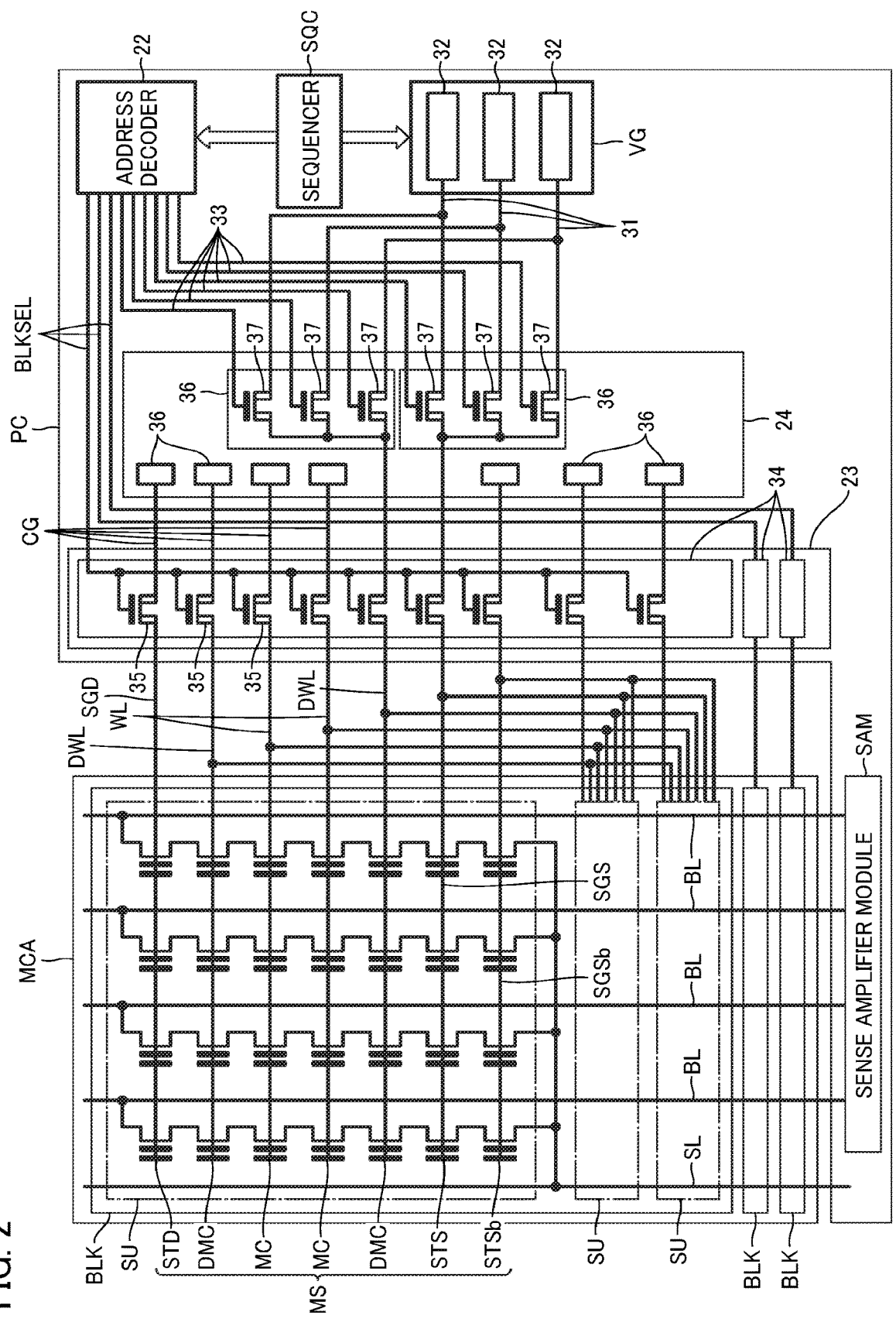
FIG. 2 is a schematic circuit diagram illustrating a part of a configuration of the semiconductor memory device according to the first embodiment.

FIG. 1 is a schematic block diagram illustrating a configuration of the semiconductor memory device according to the first embodiment. FIG. 2 is a schematic circuit diagram illustrating a part of the configuration of the semiconductor memory device.

FIG. 1 indicates a plurality of control terminals or the like. The plurality of control terminals may be represented as a control terminal corresponding to a high active signal (positive logic signal) and may be represented as a control terminal corresponding to a low active signal (negative logic signal) and may be represented as a control terminal corresponding to both the high active signal and the low active signal. In FIG. 1, a reference numeral of the control terminal corresponding to the low active signal includes an overline. In this specification, the reference numeral of the control terminal corresponding to the low active signal includes slash ("/"). The description in FIG. 1 is an example and a specific aspect is adjustable as necessary. For example, some or all of the high active signal can be set to be the low active signal, and some or all of the low active signal can also be set to the high active signal.

As shown in FIG. 1, the semiconductor memory device includes a memory cell array MCA storing data, a peripheral circuit PC connected to the memory cell array MCA. The peripheral circuit PC includes a voltage generation circuit VG, a row decoder RD, a sense amplifier module SAM, and a sequencer SQC. The peripheral circuit PC includes a cache memory CM, an address register ADR, a command register CMR, and a status register STR. The peripheral circuit PC includes an input/output control circuit I/O and a logic circuit CTR.

[Circuit Configuration of Memory Cell Array MCA]

As shown in FIG. 2, the memory cell array MCA includes a plurality of memory blocks BLK. The plurality of memory blocks BLK each include a plurality of string units SU. The plurality of string units SU each includes a plurality of memory strings MS. The plurality of memory strings MS have one ends each connected to the peripheral circuit PC via a bit line BL. The plurality of memory strings MS have the other ends each connected to the peripheral circuit PC via a common source line SL.

The memory string MS includes a drain-side select transistor STD, a plurality of dummy memory cells DMC on the bit line BL side, a plurality of memory cells MC, a plurality of dummy memory cells DMC on the source line SL side, the source-side select transistor STS, and a source-side select transistor STSb, which are connected in series between the bit line BL and the source line SL. Hereinafter, the drain-side select transistor STD, the source-side select transistor STS, and the source-side select transistor STSb may be simply referred to as select transistors (STD, STS, STSb).

The memory cell MC is a field-effect type transistor including a semiconductor layer that functions as a channel region, a gate insulating film including an electric charge accumulating film, and a gate electrode. The memory cell MC has a threshold voltage that changes according to an electric charge amount in the electric charge accumulating film. The memory cell MC stores data of one bit or a plurality of bits. Word lines WL are connected to respective gate electrodes of the plurality of memory cells MC corresponding to one memory string MS. These respective word lines WL are connected to all of the memory strings MS in one memory block BLK in common.

The dummy memory cell DMC has a structure similar to that of the memory cell MC. However, the dummy memory cell DMC does not store data. Dummy word lines DWL are connected to respective gate electrodes of the plurality of dummy memory cells DMC corresponding to one memory string MS. These respective dummy word lines DWL are connected to all of the memory strings MS in one memory block BLK in common.

The select transistor (STD, STS, STSb) is a field-effect type transistor including a semiconductor layer that functions as a channel region, a gate insulating film, and a gate electrode. The select gate lines (SGD, SGS, SGSb) are connected to the respective gate electrodes of the select transistors (STD, STS, STSb). The drain side select gate line SGD is disposed corresponding to the string unit SU and connected to all of the memory strings MS in one string unit SU in common. The source side select gate line SGS and the source side select gate line SGSb are connected to all of the memory strings MS in one memory block BLK in common.

[Circuit Configuration of Voltage Generation Circuit VG]

For example, as illustrated in FIG. 2, the voltage generation circuit VG (FIG. 1) is connected to a plurality of voltage supply lines 31. The voltage generation circuit VG includes, for example, a step down circuit such as a regulator and a step up circuit such as a charge pump circuit 32. These step down circuit and step up circuit are each connected to a voltage supply line (FIG. 1) where a power supply voltage $V_{CC}$ and a ground voltage $V_{SS}$ are supplied. For example, the voltage generation circuit VG generates a plurality of patterns of operating voltages supplied to the bit line BL, the source line SL, the word line WL, the dummy word line DWL, and the select gate line (SGD, SGS, SGSb) in a read operation, a write operation, and an erase operation on the memory cell array MCA, in accordance with a control signal from the sequencer SQC to simultaneously output the operating voltages to the plurality of voltage supply lines 31. The operating voltage output from the voltage supply line 31 is appropriately adjusted in accordance with the control signal from the sequencer SQC.

[Circuit Configuration of Row Decoder RD]

The row decoder RD (FIG. 1) includes, for example, as illustrated in FIG. 2, an address decoder 22 that decodes address data $D_{ADD}$, a block select circuit 23 and a voltage select circuit 24 that transfer the operating voltage to the memory cell array MCA in response to an output signal from the address decoder 22.

The address decoder 22 includes a plurality of block select lines BLKSEL and a plurality of voltage select lines 33. The address decoder 22, for example, sequentially refers to a row address RA in the address register ADR (FIG. 1) in response to the control signal from the sequencer SQC, decodes this row address RA to turn ON a predetermined block select transistor 35 and a voltage select transistor 37 corresponding to the row address RA and turn OFF the block select transistors 35 and the voltage select transistors 37 other than the above. For example, the voltages of the predetermined block select line BLKSEL and the voltage select line 33 are set to be in a state of "H" and the voltages other than those are set to be in a state of "L." When a P channel type transistor is used, not an N channel type transistor, a reverse voltage is applied to these wirings.

In the illustrated example, in the address decoder 22, one block select line BLKSEL is disposed per one memory block BLK. However, this configuration is appropriately changeable. For example, one block select line BLKSEL may be included in per two or more memory blocks BLK.

The block select circuit 23 includes a plurality of block selectors 34 corresponding to the memory blocks BLK. The plurality of block selectors 34 each include a plurality of block select transistors 35 corresponding to the word lines WL, the dummy word lines DWL, and the select gate lines (SGD, SGS, SGSb). The block select transistor 35 is, for example, a field-effect type high voltage transistor. The block select transistors 35 have drain electrodes each electrically connected to the corresponding word line WL, dummy word line DWL, or select gate line (SGD, SGS, SGSb). The block select transistors 35 have source electrodes each electrically connected to the voltage supply line 31 via a wiring CG and the voltage select circuit 24. The block select transistors 35 have gate electrodes commonly connected to the corresponding block select line BLKSEL.

The block select circuit 23 further includes a plurality of transistors (not illustrated). The plurality of transistors are field-effect type high voltage transistors connected between the select gate lines (SGD, SGS, SGSb) and the voltage supply lines to which the ground voltage $V_{SS}$ is supplied. The plurality of transistors supply the select gate lines (SGD, SGS, SGSb) included in the unselected memory blocks BLK with the ground voltage $V_{SS}$. The plurality of word lines WL included in the unselected memory blocks BLK enter a floating state.

The voltage select circuit 24 includes a plurality of voltage selectors 36 corresponding to the word lines WL, the dummy word lines DWL, and the select gate lines (SGD, SGS, SGSb). The plurality of voltage selectors 36 each include a plurality of voltage select transistors 37. The voltage select transistor 37 is, for example, a field-effect type high voltage transistor. The voltage select transistors 37 have drain terminals each electrically connected to the corresponding word line WL, the dummy word line DWL, or the select gate line (SGD, SGS, SGSb) via the wiring CG and the block select circuit 23. The source terminals are each electrically connected to the corresponding voltage supply line 31. The gate electrodes are each connected to the corresponding voltage select line 33.

In the illustrated example, the wiring CG is connected to the voltage supply line 31 via one voltage select transistor 37. However, such configuration is merely an example, and s specific configuration is appropriately changeable. For example, the wiring CG may be connected to the voltage supply line 31 via two or more of the voltage select transistors 37.

[Circuit Configuration of Sense Amplifier Module SAM]

The sense amplifier module SAM includes, for example, a plurality of sense amplifier units corresponding to the plurality of bit lines BL. The sense amplifier units each include a sense node electrically connected to the bit line BL, a sense transistor electrically connected to the sense node, a data wiring electrically connected to the sense transistor, and a plurality of latch circuit electrically connected to the data wiring. The sense amplifier units each include a voltage transfer circuit electrically connected to the bit line BL, and a controlling latch circuit electrically connected to the voltage transfer circuit. The sense node is electrically conducted with the bit line BL at a predetermined timing of the read operation or the like. The sense transistor includes a gate electrode electrically connected to the sense node. The sense transistor turns ON or turns OFF corresponding to the voltage of the sense node. The data wiring is charged or discharged depending on whether the sense transistor is in the ON state or the OFF state. The plurality of latch circuits and the controlling latch circuit latch data of "1" or "0" corresponding to the voltage of the data wiring. The voltage transfer circuit electrically conduct the bit line BL with any one of two voltage supply lines corresponding to the data latched by the controlling latch circuit.

[Circuit Configuration of Cache Memory CM]

The cache memory CM (FIG. 1) includes a plurality of latch circuits connected to the plurality of latch circuits inside the sense amplifier module SAM via a wiring DBUS. Data DAT included in the plurality of latch circuits is sequentially transferred to the sense amplifier module SAM or the input/output control circuit I/O.

A decode circuit and a switch circuit (not illustrated) are connected to the cache memory CM. The decode circuit decodes a column address CA held in the address register ADR (FIG. 1). The switch circuit electrically conducts the latch circuit corresponding to the column address CA with a bus DB (FIG. 1) in response to an output signal from the decode circuit.

[Circuit Configuration of Sequencer SQC]

The sequencer SQC (FIG. 1) outputs an internal control signal to the row decoder RD, the sense amplifier module SAM, and the voltage generation circuit VG in accordance with command data $D_{CMD}$ held in the command register CMR. The sequencer SQC outputs status data $D_{ST}$ indicating its own state to the status register STR as necessary.

The sequencer SQC generates a ready/busy signal and outputs to a terminal RY/(/BY). In a period when the terminal RY/(/BY) is in a state of "L" (busy period), access to the semiconductor memory device is basically inhibited. In a period when the terminal RY/(/BY) is in a state of "H" (ready period), the access to the semiconductor memory device is permitted.

[Circuit Configuration of Input/Output Control Circuit I/O]

The input/output control circuit I/O includes data signal input/output terminals DQ0 to DQ7, toggle signal input/output terminals DQS, /DQS, an input circuit such as a comparator, and an output circuit such as an Off Chip Driver (OCD) circuit. The input circuit and the output circuit are connected to the data signal input/output terminals DQ0 to DQ7. The input/output control circuit I/O includes a shift register connected to the input circuit and the output circuit, and a buffer circuit. The input circuit, the output circuit, the shift register, and the buffer circuit are each connected to a terminal to which a power supply voltage $V_{CCQ}$ and the ground voltage $V_{SS}$ are supplied. Data input via the data signal input/output terminals DQ0 to DQ7 are output from the buffer circuit to the cache memory CM, the address register ADR, or the command register CMR in response to the internal control signal from the logic circuit CTR. Data output via the data signal input/output terminals DQ0 to DQ7 are input to the buffer circuit from the cache memory CM or the status register STR in response to the internal control signal from the logic circuit CTR.

[Circuit Configuration of Logic Circuit CTR]

The logic circuit CTR (FIG. 1) receives an external control signal from the controller via external control terminals /CEn, CLE, ALE, /WE, RE, /RE and outputs the internal control signal to the input/output control circuit I/O in response thereto.

[Structure of Semiconductor Memory Device]

Figure 3:
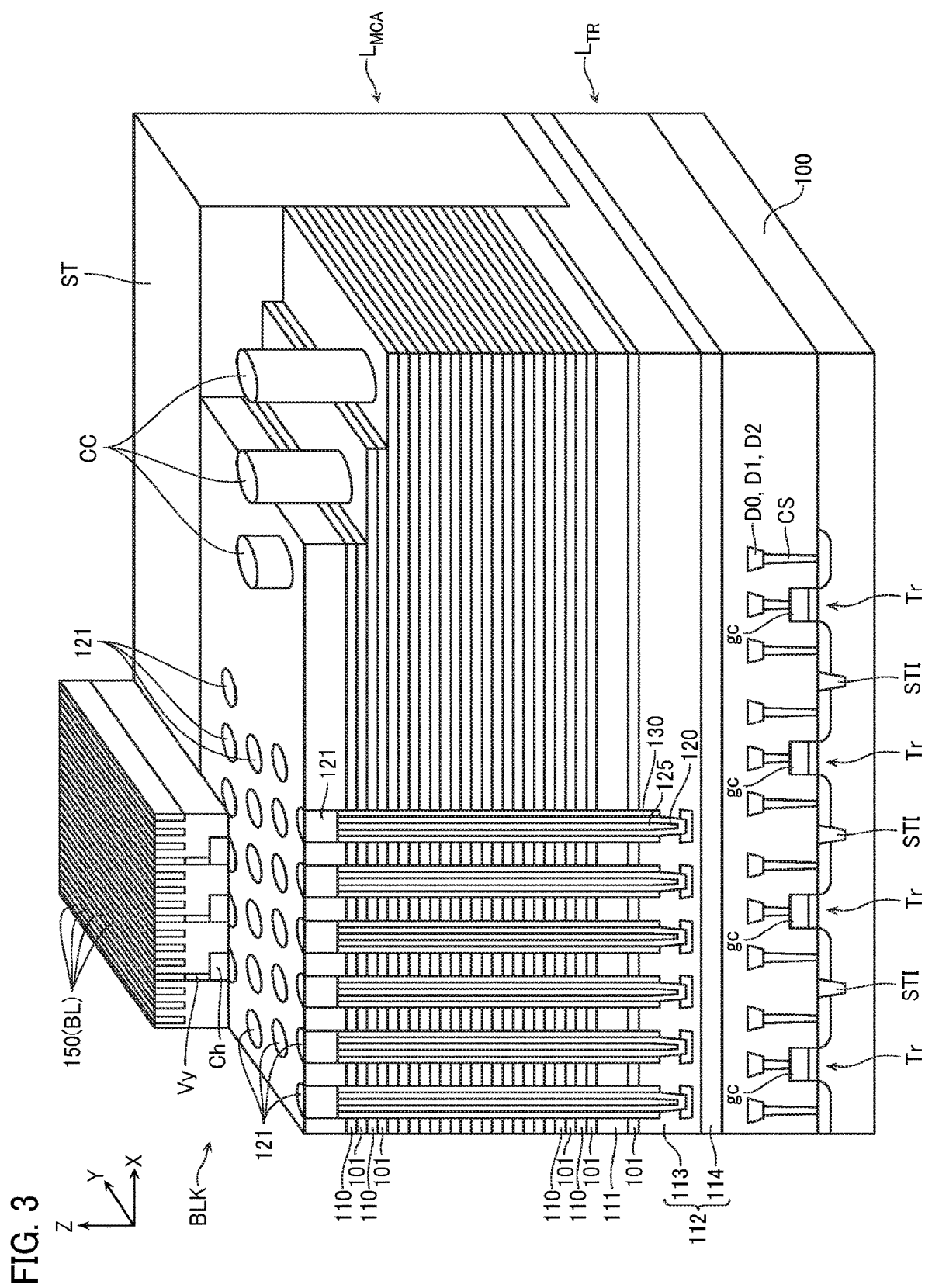
FIG. 3 is a schematic perspective view illustrating a part of the configuration of the semiconductor memory device according to the first embodiment.
Figure 4:
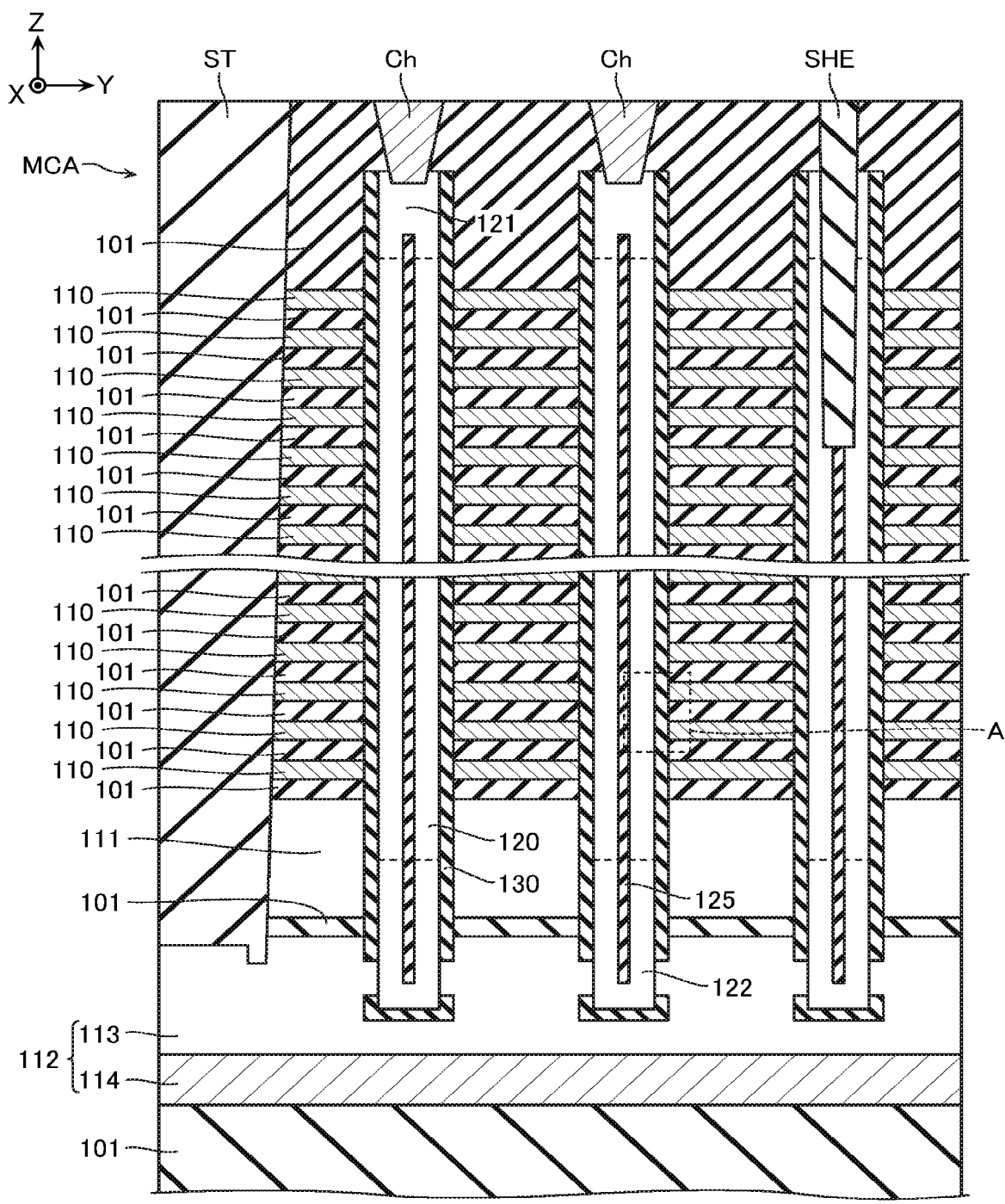
FIG. 4 is a schematic cross-sectional view illustrating a part of the configuration of the semiconductor memory device according to the first embodiment.
Figure 5:
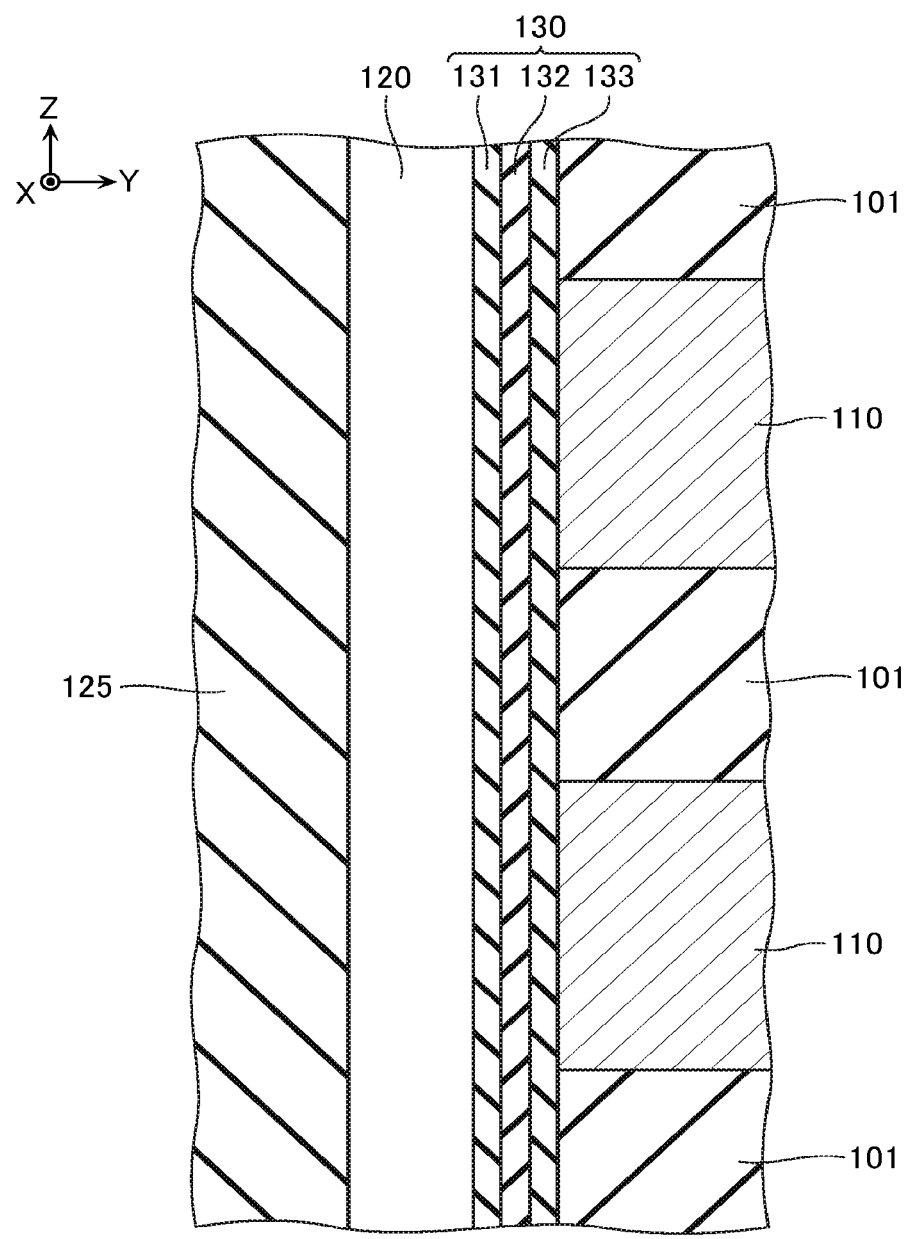
FIG. 5 is a schematic enlarged view of a part indicated by A in FIG. 4.

FIG. 3 is a schematic perspective view illustrating a part of the configuration of the semiconductor memory device. FIG. 4 is a schematic cross-sectional view illustrating a part of the configuration of the semiconductor memory device. FIG. 5 is a schematic enlarged view of the portion indicated by A in FIG. 4.

The semiconductor memory device includes, for example, as shown in FIG. 3, a semiconductor substrate 100, a transistor layer $L_{TR}$ disposed on the semiconductor substrate 100, wiring layers D0 to D2 disposed in the upper portion of the transistor layer $L_{TR}$, a memory cell array layer $L_{MCA}$ disposed above the wiring layers D0 to D2, and a plurality of wiring layers disposed above the memory cell array layer $L_{MCA}$.

[Structure of Semiconductor Substrate 100]

The semiconductor substrate 100 is, for example, a semiconductor substrate of P type silicon (Si) containing P type impurities such as boron (B). For example, in the surface of the semiconductor substrate 100, an N type well region containing N type impurities such as phosphorus (P), a P type well region containing P type impurities such as boron (B), a semiconductor substrate region where the N type well region or the P type well region is not disposed, and an insulating region STI are disposed.

[Structure of Transistor Layer $L_{TR}$]

For example, as illustrated in FIG. 3, a plurality of electrodes gc are disposed on the upper surface of the semiconductor substrate 100 via an insulating layer. Respective regions of the semiconductor substrate 100 and the plurality of electrodes gc are each connected to a contact CS.

The N type well region, the P type well region, and the semiconductor substrate region of the semiconductor substrate 100 each function as a channel region of the plurality of transistors Tr, one electrode of a plurality of capacitors, and the like constituting the peripheral circuit PC (FIG. 1, FIG. 2).

The plurality of electrodes gc each function as the gate electrodes of the plurality of transistors Tr, the other electrodes of the plurality of capacitors, and the like constituting the peripheral circuit PC.

The contact CS extends in the Z-direction and is connected to the semiconductor substrate 100 at a lower end or to the upper surface of the electrode gc. In a connection part between the contact CS and the semiconductor substrate 100, an impurity region containing the N type impurities or the P type impurities is disposed. For example, the contact CS may include a stacked film of a barrier conductive film such as titanium nitride (TiN) and a metal film such as tungsten (W), or the like.

[Structure of Wiring Layers D0 to D2]

For example, as illustrated in FIG. 3, a plurality of wirings included in the wiring layers D0 to D2 are electrically connected to at least one of the configurations in the memory cell array MCA and the configuration in the peripheral circuit PC.

The plurality of wirings included in the wiring layers D0 to D2 may include, for example, a stacked film of a barrier conductive film such as titanium nitride (TiN) and a metal film such as tungsten (W), or the like.

[Structure of Memory Cell Array Layer $L_{MCA}$]

For example, as shown in FIG. 3, in the memory cell array layer $L_{MCA}$, the memory block BLK and an inter-block insulating layer ST such as silicon dioxide ($SiO_2$) are disposed. The memory block BLK includes a plurality of conductive layers 110 arranged in the Z-direction, a plurality of semiconductor layers 120 extending in the Z-direction, and a plurality of gate insulating films 130 each disposed between the plurality of conductive layers 110 and the plurality of semiconductor layers 120.

The conductive layer 110 is a substantially plate-shaped conductive layer extending in the X-direction. The conductive layer 110 may include a stacked film of a barrier conductive film such as titanium nitride (TiN) and a metal film such as tungsten (W), or the like. For example, the conductive layer 110 may contain polycrystalline silicon containing impurities such as phosphorus (P) or boron (B), or the like. Between the plurality of conductive layers 110 arranged in the Z-direction, insulating layers 101, such as silicon dioxide ($SiO_2$), are disposed.

A conductive layer 111 is disposed below the conductive layers 110. For example, the conductive layer 111 may include polycrystalline silicon containing impurities, such as phosphorus (P) or boron (B), or the like. Between the conductive layer 111 and the conductive layers 110, the insulating layer 101, such as silicon dioxide ($SiO_2$) is disposed.

A conductive layer 112 is disposed below the conductive layer 111. The conductive layer 112 includes a semiconductor layer 113 connected on lower ends of the semiconductor layers 120 and a conductive layer 114 connected on a lower surface of the semiconductor layer 113. The semiconductor layer 113 may contain, for example, polycrystalline silicon containing the N type impurities such as phosphorus (P), or the like. The conductive layer 114 may include, for example, a metal such as tungsten (W), a conductive layer such as tungsten silicide, or another conductive layer. Between the conductive layer 112 and the conductive layer 111, the insulating layer 101 such as silicon dioxide ($SiO_2$) is disposed.

The conductive layer 112 functions as the source line SL (FIG. 2). The source line SL is commonly disposed for the plurality of memory blocks BLK.

The conductive layer 111 functions as the source side select gate line SGSb (FIG. 2) and the gate electrodes of the plurality of source-side select transistors STSb connected thereto. The conductive layers 111 are electrically independent for each memory block BLK.

Among the plurality of conductive layers 110, the plurality of conductive layers 110 positioned at the lowermost layer function as the source side select gate line SGS (FIG. 2) and the gate electrodes of the plurality of source-side select transistors STS connected thereto. The plurality of conductive layers 110 are electrically independent for each memory block BLK.

The plurality of conductive layers 110 positioned above them function as the dummy word lines DWL and the gate electrodes of the plurality of dummy memory cells DMC connected thereto. The plurality of conductive layers 110 are each electrically independent for each memory block BLK.

The plurality of conductive layers 110 positioned above them function as the word lines WL (FIG. 2) and the gate electrodes of the plurality of memory cells MC (FIG. 2) connected thereto. The plurality of conductive layers 110 are each electrically independent for each memory block BLK.

The plurality of conductive layers 110 positioned above them function as the dummy word lines DWL and the gate electrodes of the plurality of dummy memory cells DMC connected thereto. The plurality of conductive layers 110 are each electrically independent for each memory block BLK.

One or the plurality of conductive layers 110 positioned above them function as the drain side select gate lines SGD and the gate electrodes of the plurality of drain-side select transistor STD (FIG. 2) connected thereto. The plurality of conductive layers 110 are separated into a plurality of portions via inter-string unit insulating layers SHE and are each electrically independent for each string unit SU.

At the end portion in the X-direction of the plurality of conductive layers 110, contacts CC extending in the Z-direction are disposed. The plurality of conductive layers 110 are connected to the peripheral circuit PC via the plurality of contacts CC.

The semiconductor layers 120 are arranged in the X-direction and the Y-direction in a predetermined pattern. The semiconductor layers 120 function as the channel regions of the plurality of memory cells MC, the plurality of dummy memory cells DMC, and the select transistors (STD, STS, STSb) included in one memory string MS (FIG. 2). The semiconductor layer 120 is, for example, a semiconductor layer such as polycrystalline silicon (Si). The semiconductor layer 120 has, for example, as illustrated in FIG. 4, a substantially cylindrical shape and includes an insulating layer 125 such as silicon dioxide in the center portion. The outer peripheral surfaces of the semiconductor layers 120 are each surrounded by the conductive layers 110 via the gate insulating film 130 and facing the conductive layers 110. The outer peripheral surfaces of the semiconductor layers 120 are each also surrounded by the conductive layer 111 and facing the conductive layer 111 via the gate insulating film 130. In the example in FIG. 4, the upper end portion and the lower end portion of the semiconductor layer 120 is indicated by the dashed lines.

In the upper end portion of the semiconductor layer 120, an impurity region 121 containing the N type impurities such as phosphorus (P) is disposed. In the example in FIG. 4, a boundary line between the upper end portion of the semiconductor layer 120 and the impurity region 121 is indicated by the dashed line. The impurity region 121 is connected to a conductive layer 150 extending in the Y-direction, via a contact Ch and a contact Vy (FIG. 3). The conductive layer 150 functions as the bit line BL. The conductive layer 150 may include, for example, a stacked film of a barrier conductive film such as titanium nitride (TiN) and a metal film such as copper (Cu), or the like.

At the lower end portion of the semiconductor layer 120, for example, as shown in FIG. 4, an impurity region 122 containing the N type impurities such as phosphorus (P) is disposed. In the example in FIG. 4, a boundary line between the lower end portion of the semiconductor layer 120 and the impurity region 122 is indicated by the dashed line. The impurity regions 122 are connected to the semiconductor layer 113 of the conductive layer 112. In the semiconductor layer 120, a portion positioned immediately above the impurity region 122 functions as a channel region of the source-side select transistor STSb. An outer peripheral surface of the impurity region 122 is surrounded by the conductive layer 111 and facing the conductive layer 111 via the gate insulating film 130.

The gate insulating film 130 has a substantially closed-bottomed cylindrical shape that covers the outer peripheral surface of the semiconductor layer 120. The gate insulating film 130 includes, for example, as illustrated in FIG. 5, a tunnel insulating film 131, an electric charge accumulating film 132, and a block insulating film 133, which are stacked between the semiconductor layer 120 and the conductive layers 110. The tunnel insulating film 131 and the block insulating film 133 are, for example, insulating films of silicon dioxide ($SiO_2$) or the like. The electric charge accumulating film 132 is, for example, a film of silicon nitride ($Si_3N_4$) or the like that can accumulate the electric charges. The tunnel insulating film 131, the electric charge accumulating film 132, and the block insulating film 133 have substantially cylindrical shapes and extend in the Z-direction along the outer peripheral surface of the semiconductor layer 120.

FIG. 5 illustrates an example in which the gate insulating film 130 includes the electric charge accumulating film 132 of silicon nitride or the like. However, the gate insulating film 130 may include, for example, a floating gate of polycrystalline silicon containing the N type or P type impurities, or the like.

[Threshold Voltage of Memory Cell MC]

Figure 6:
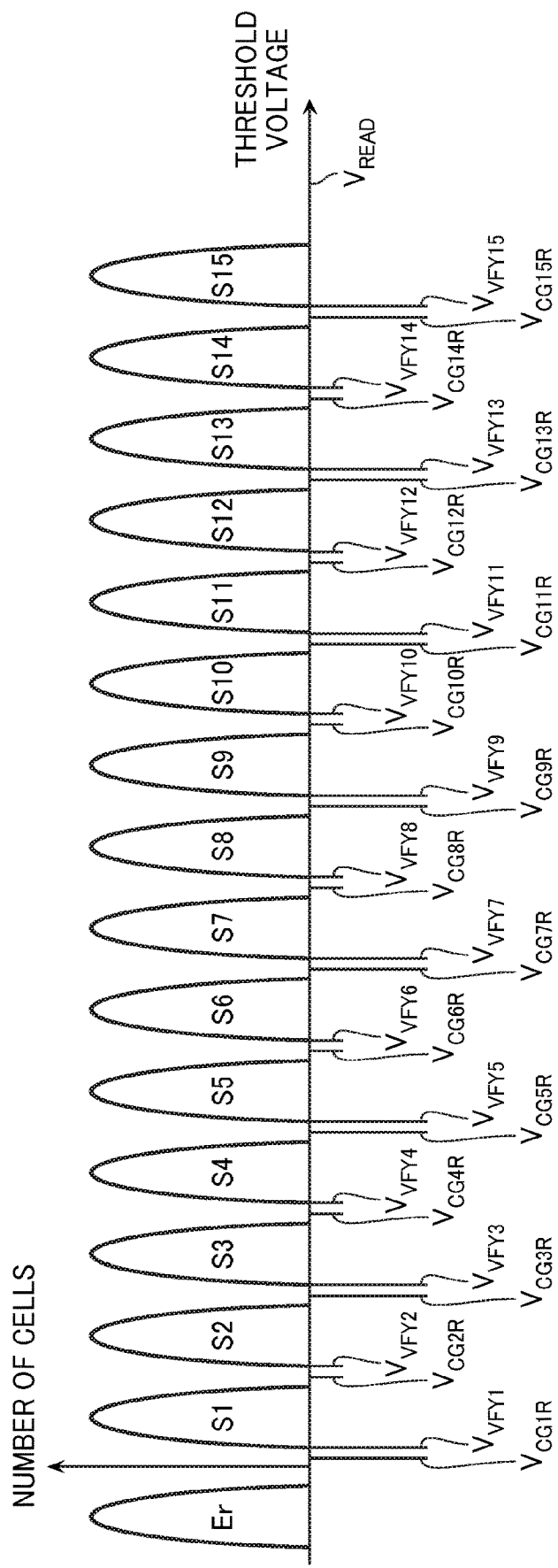
FIG. 6 is a schematic histogram for describing a threshold voltage of a memory cell MC where data of 4 bits is recorded.

Next, with reference to FIG. 6, the threshold voltage of the memory cell MC is described.

As described above, the memory cell array MCA includes the plurality of memory cells MC. When a write sequence is performed to the plurality of memory cells MC, the threshold voltages of these memory cells MC are controlled in a plurality of states.

FIG. 6 is a schematic histogram for describing the threshold voltage of the memory cell MC where data of 4 bit is recorded. The horizontal axis indicates a voltage of the word line WL and the longitudinal axis indicates the number of the memory cell MC.

In the example in FIG. 6, the threshold voltage of the memory cell MC is controlled in 16 states. For example, the threshold voltage of the memory cell MC controlled in a state S1 is larger than a read voltage $V_{CG1R}$ and a verify voltage $V_{VFY1}$ in FIG. 6 and smaller than a read voltage $V_{CC2R}$ and the verify voltage $V_{VFY2}$. Every threshold voltage of the memory cell MC is smaller than a read pass voltage $V_{READ}$.

For example, a state Er corresponds to a lowest threshold voltage (the threshold voltage of the memory cell MC in an erase state). For example, data "1111" may be assigned to the memory cell MC corresponding to the state Er.

The state S1 corresponds to the threshold voltage higher than the threshold voltage corresponding to the state Er. For example, data "1011" may be assigned to the memory cell MC corresponding to the state S1.

A state S2 corresponds to the threshold voltage higher than the threshold voltage corresponding to the state S1. For example, data "0011" may be assigned to the memory cell MC corresponding to the state S2.

The same applies to the following, and the threshold voltages corresponding to a state S3 to a state S15 in the drawing are each higher than the threshold voltages corresponding to the state S2 to the state S14. For example, data of 4 bits other than "1111," "1011," or "0011" described above may be assigned to the memory cells MC corresponding to the distribution of them.

The number of bits of the data recorded in the memory cell MC, the number of states, the assignment of the data to each state, and the like are changeable as necessary.

For example, when "1" is assigned to every fourth bit of the state Er and the state S1 to the state S7, and "0" is assigned to every fourth bit of the state S8 to the state S15, the word line WL is supplied with the read voltage $V_{CG8R}$ in reading the data of the fourth bit.

For example, when "1" is assigned to every third bit of the state Er and the state S1 to the state S3, "0" is assigned to every third bit of the state S4 to the state S11, and "1" is assigned to every third bit of the state S12 to the state S15, the word line WL is supplied with the read voltages $V_{CG4R}$ and $V_{CG12R}$ in reading the data of the third bit.

[Read Operation]

Figure 7:
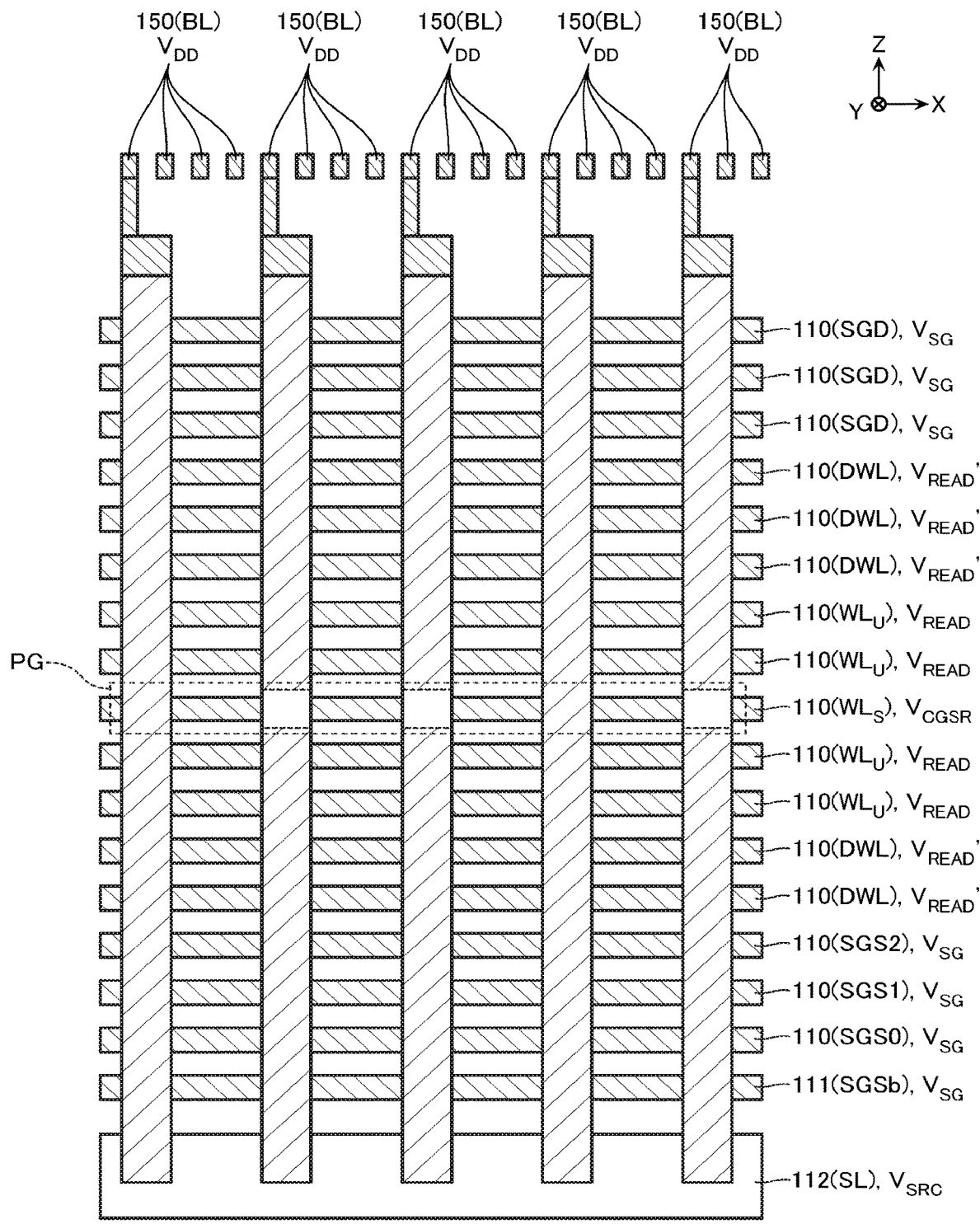
FIG. 7 is a schematic cross-sectional view for describing a read operation.

Next, with reference to FIG. 7 and the like, the read operation of the semiconductor memory device according to the embodiment is described. FIG. 7 is a schematic cross-sectional view for describing the read operation.

In the following description, the word line WL that is a target of the operation may be referred to as "selected word line $WL_S$" and the word line WL other than the target of the operation may be referred to as "unselected word line $WL_U$." In the following description, an example where the read operation is performed to memory cells MC (hereinafter sometimes referred to as "selected memory cells MC") connected to the selected word line $WL_S$ among the plurality of memory cells MC included in the string unit SU is described. In the following description, the configuration including such plurality of selected memory cells MC may be referred to as a selected page PG.

When performing read operation on the memory cells MC, for example, the bit lines BL and the like are charged. That is, the voltage $V_{DD}$ is supplied to the bit lines BL and the sense node in the sense amplifier module SAM (FIG. 1, FIG. 2) to charge them. For example, a voltage $V_{SRC}$ is supplied to the source line SL (FIG. 2) to start the charge. The voltage $V_{SRC}$ has, for example, a magnitude similar to that of the ground voltage $V_{SS}$. The voltage $V_{SRC}$ is, for example, larger than the ground voltage $V_{SS}$ and smaller than the voltage $V_{DD}$.

The plurality of selected memory cells MC included in the selected page PG are electrically conducted with the bit lines BL and the source line SL. For example, the select gate lines (SGD, SGS, SGSb) are supplied with a voltage $V_{SG}$ to turn ON the select transistors (STD, STS, STSb). The unselected word line $WL_U$ is supplied with the read pass voltage $V_{READ}$ to turn ON all the memory cells MC connected to the unselected word line $WL_U$. The dummy word lines DWL are supplied with a voltage $V_{READ}'$ to turn ON all the dummy memory cells DMC. The voltage $V_{READ}'$ is larger than the ground voltage $V_{SS}$ and smaller than the read pass voltage $V_{READ}$.

The selected word line $WL_S$ is supplied with a read voltage $V_{CGSR}$ (any of the read voltage $V_{CG1R}$ to $V_{CG15R}$ in FIG. 6). Thus, some memory cells MC are turned ON and other memory cells MC are turned OFF.

The ON state/OFF state of the selected memory cells MC is detected by the sense amplifier module SAM (FIG. 1, FIG. 2). For example, the sense nodes in the sense amplifier module SAM are electrically conducted with the bit lines BL, and the electric charge of the sense nodes are maintained or discharged to turn ON or turn OFF the sense transistors. The electric charge of the data wiring is charged or discharged corresponding to the state of the sense transistor to latch the data corresponding to the voltage of this wiring by any of the plurality of latch circuits connected to the data wiring. Thus, the data indicating the state of the selected memory cell MC is latched in the latch circuit.

Hereinafter, as necessary, the read voltage $V_{CGSR}$ supplied to the selected word line $WL_S$ is sequentially switched to detect the ON state/OFF state of the selected memory cell MC. Next, an arithmetic processing such as AND, OR, or the like is performed for the detected data to calculate the data stored in the selected memory cells MC. Then, the calculated data is output to the cache memory CM. Then, for example, the data latched in the cache memory CM is output via the bus DB (FIG. 1) and the input/output control circuit I/O (FIG. 1).

[Write Sequence]

Figure 8:
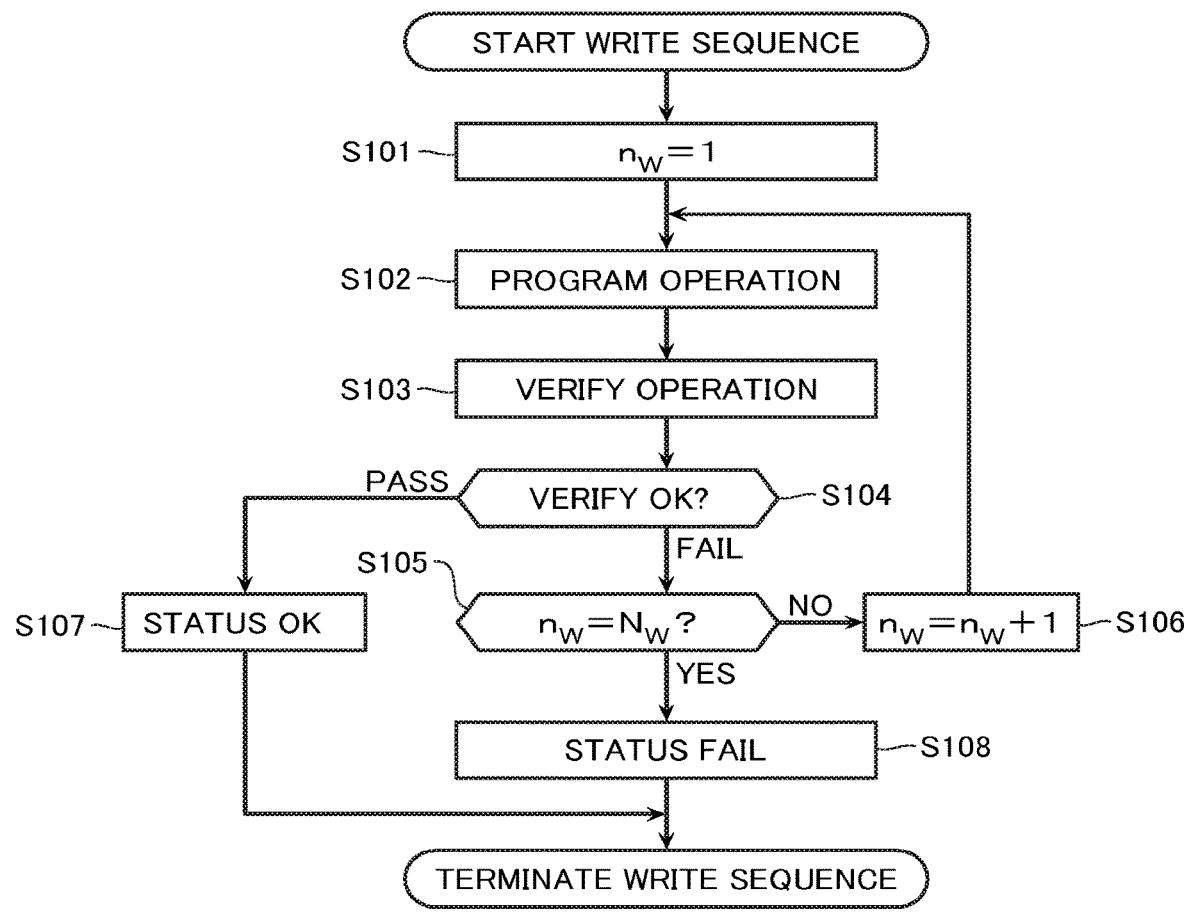
FIG. 8 is a schematic flowchart for describing a write sequence.
Figure 9:
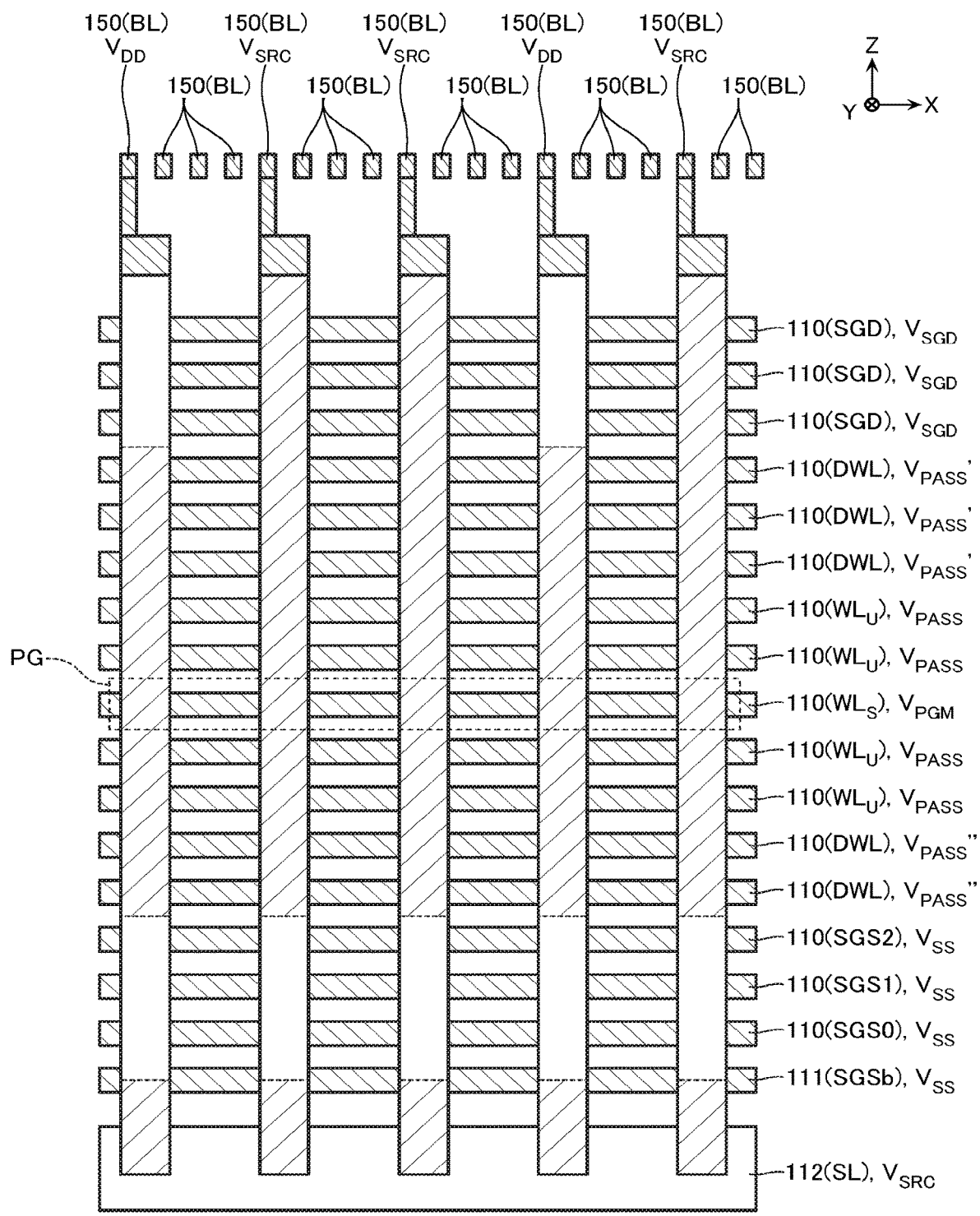
FIG. 9 is a schematic cross-sectional view for describing a program operation.
Figure 10:
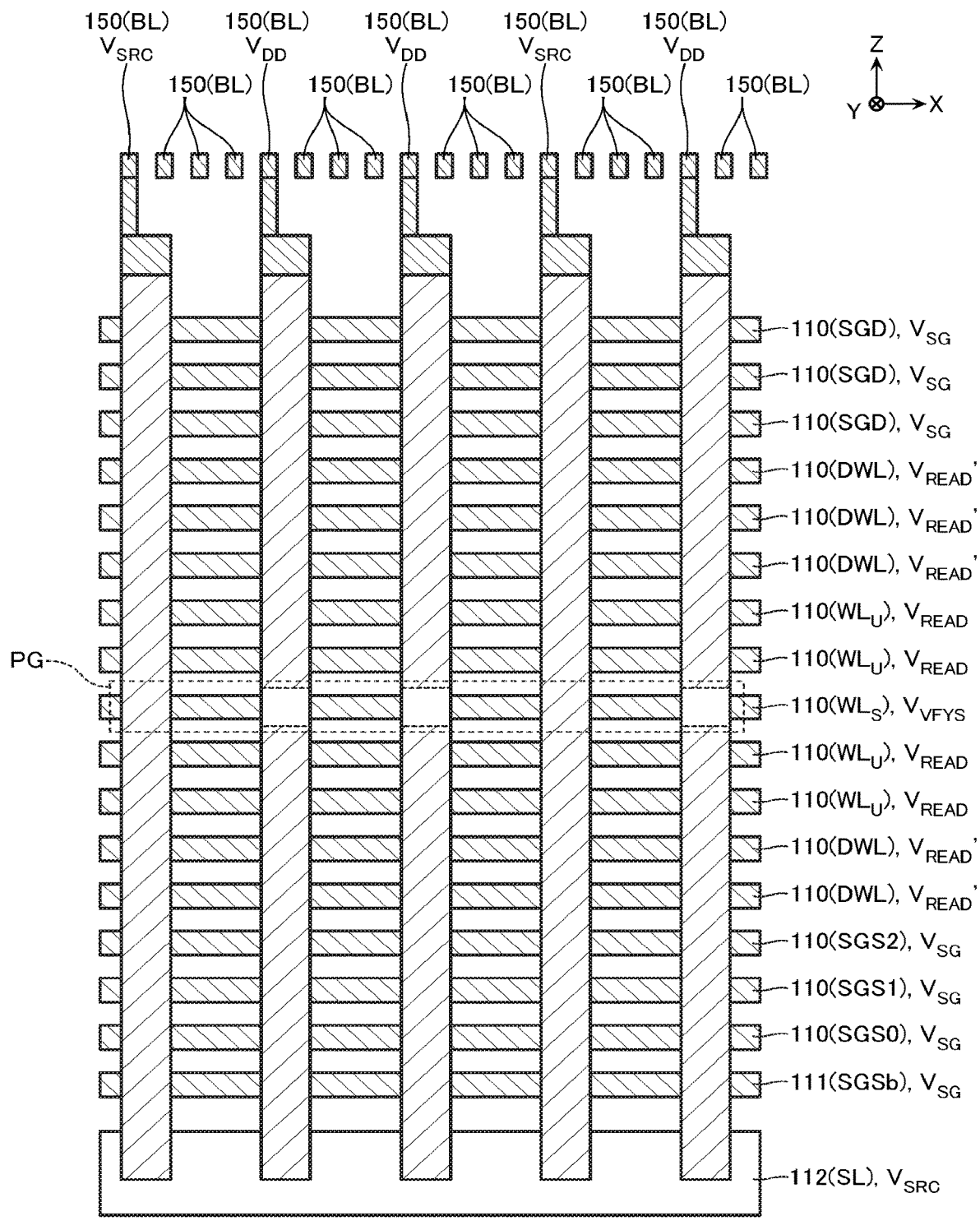
FIG. 10 is a schematic cross-sectional view for describing a verify operation.

Next, with reference to FIGS. 8 to 10, the write sequence of the semiconductor memory device is described. FIG. 8 is a schematic flowchart for describing the write sequence. FIG. 9 is a schematic cross-sectional view for describing the program operation included in the write sequence. FIG. 10 is a schematic cross-sectional view for describing a verify operation included in the write sequence.

At Step S101 (FIG. 8), a loop count $n_W$ is set to one. The loop count $n_W$ is recorded in the register or the like.

At Step S102, the program operation is performed.

When performing the program operation, for example, the bit lines BL connected to the selected memory cells MC whose threshold voltages are to be adjusted (hereinafter sometimes referred to as "write memory cell MC") are supplied with the voltage $V_{SRC}$. Additionally, the bit lines BL connected to the selected memory cells MC whose threshold voltages are not to be adjusted (hereinafter sometimes referred to as "inhibited memory cell MC") are supplied with the voltage $V_{DD}$. For example, among the controlling latch circuits connected to the voltage transfer circuits in the sense amplifier module SAM, the ones corresponding to the write memory cells MC are caused to latch "L," and the ones corresponding to the inhibited memory cells MC are caused to latch "H." Via the two voltage supply lines, the write memory cells MC and the inhibited memory cells MC are supplied with the different voltages.

As shown in FIG. 9, the write memory cell MC is selectively electrically conducted with the bit line BL. For example, the drain side select gate line SGD is supplied with the voltage $V_{SGD}$. The voltage $V_{SGD}$ is, for example, smaller than the voltage $V_{SG}$, in FIG. 7. Thus, the drain-side select transistors STD corresponding to the bit lines BL to which the voltage $V_{SRC}$ is supplied are turned ON and the drain-side select transistors STD corresponding to the bit lines BL to which the voltage $V_{DD}$ is supplied are turned OFF. The unselected word lines $WL_U$ are supplied with the write pass voltage $V_{PASS}$. The write pass voltage $V_{PASS}$ is, for example, larger than the read pass voltage $V_{READ}$ in FIG. 6 and the voltage $V_{SS}$ in FIG. 7. That is, the read pass voltage $V_{READ}$ and the voltage $V_{SG}$ is smaller than the write pass voltage $V_{PASS}$. The dummy word lines DWL on the drain-side select transistor STD side are supplied with a voltage $V_{PASS}'$. The voltage $V_{PASS}'$ is larger than the voltage $V_{SGD}$ and smaller than the write pass voltage $V_{PASS}$. The source side select gate lines SGS2, SGS1, SGS0, SGSb are supplied with the ground voltage V. The dummy word lines DWL on the source-side select transistor STS side are supplied with a voltage $V_{PASS}''$. The voltage $V_{PASS}''$ is larger than the ground voltage $V_{SS}$ and smaller than the write pass voltage $V_{PASS}$.

As shown in FIG. 9, the selected word line $WL_S$ is supplied with a program voltage $V_{PGM}$. The program voltage $V_{PGM}$ is larger than the write pass voltage $V_{PASS}$ and the voltage $V_{SG}$. That is, the write pass voltage $V_{PASS}$ and the voltage $V_{SG}$ are smaller than the program voltage $V_{PGM}$. Thus, the electrons are accumulated in the electric charge accumulating films 132 (FIG. 5) of the write memory cells MC and the threshold voltages of the write memory cells MC increase.

At Step S103 (FIG. 8), the verify operation is performed.

In the verify operation, for example, the bit lines BL or the like is charged. The selected memory cells MC are selectively electrically conducted with the bit lines BL and the source line SL. As shown in FIG. 10, the selected word line $WL_S$ is supplied with the verify voltage $V_{VFYS}$ (any of the verify voltage $V_{VFY1}$ to $V_{VFY15}$ in FIG. 6) to detect the ON state/OFF state of the selected memory cells MC. As necessary, the verify voltage $V_{VFYS}$ supplied to the selected word line $WL_S$ is sequentially switched to detect the ON state/OFF state of the selected memory cell MC.

In the verify operation, the detection of the ON state/OFF state on the inhibited memory cells MC may be omitted. In such case, for example, in the verify operation, among the controlling latch circuits connected to the voltage transfer circuits in the sense amplifier module SAM, the latch circuits connected to the write memory cells MC may be caused to latch "H," and the latch circuits connected to the inhibited memory cells MC may be caused to latch "L."

At Step S104 (FIG. 8), results of the verify operation is determined. For example, when the data indicative of the state of the memory cells MC includes "L" equal to or more than a certain level, or the like, it is determined that verification has failed, and the process proceeds to Step S105. On the other hand, when the data indicative of the state of the memory cells MC does not include "L" equal to or more than a certain level, or the like, it is determined that verification has passed, and the process proceeds to Step S107.

At Step S105, it is determined whether the loop count $n_W$ has reached the predetermined count $N_W$ or not. When the loop count $n_W$ has not reached the predetermined count $N_W$, the process proceeds to Step S106. When the loop count $n_W$ has reached the predetermined count $N_W$, the process proceeds to Step S108.

At Step S106, 1 is added to the loop count $n_W$, the process proceeds to Step S102. At Step S106, for example, a predetermined voltage $\Delta V$ is added to the program voltage $V_{PGM}$.

At Step S107, status data $D_{ST}$ indicating that the write sequence has normally terminated is stored into the status register STR (FIG. 1) and the write sequence terminates.

At Step S108, status data $D_{ST}$ indicating that the write sequence has not normally terminated is stored into the status register STR (FIG. 1) and the write sequence terminates.

[Variation of Current Flowing into Memory Cell MC]

As described with reference to FIG. 4, the semiconductor layer 113 contains the N type impurities such as phosphorus (P). The semiconductor layer 120 has a lower end portion where the impurity region 122 containing the N type impurities such as phosphorus (P) is disposed. In such structure, for example, during manufacturing processes, the N type impurities contained in the semiconductor layer 113 and the impurity region 122 may be diffused by heat or the like to vary a range of the impurity region 122. Corresponding to variation of the range of the impurity region 122, the magnitude of the current may vary among the semiconductor layers 120.

Here, in the write sequence, based on the current flowing into the semiconductor layer 120, it is determined whether the threshold voltages of the memory cells MC have reached a target value or not. Consequently, when the magnitude of current has varied among the semiconductor layers 120, it is determined that the threshold voltages of the memory cells MC corresponding to the semiconductor layer 120 where the current hardly flows have reached the target value at a relatively early stage. On the other hand, it is determined that the threshold voltages of the memory cells MC corresponding to the semiconductor layer 120 where the current easily flows have reached the target value at a relatively late stage. Therefore, between these, the conditions suitable for controlling the threshold voltage may differ, and the loop count $n_W$ in the write sequence (FIG. 8) may increase.

Therefore, in this embodiment, to reduce the variation of the current due to such semiconductor layer 120, the electric charge is accumulated in a part of the electric charge accumulating film 132 corresponding to the variation of the current. For example, for the electric charge accumulating film 132 corresponding to the semiconductor layer 120 where the current easily flows, the electric charge is accumulated in the electric charge accumulating film 132 in portions corresponding to the plurality of conductive layers 110 functioning as the source side select gate line SGS. Thus, flowability of the current between the semiconductor layers 120 is adjusted.

According to such method, the variation of the current among the semiconductor layers 120 can be reduced. Thus, the loop count $n_W$ in the write sequence (FIG. 8) can be reduced to achieve the high speed operation of the semiconductor memory device. In some cases, in the write sequence, the verify operation can be omitted. In such case, further high speed operation of the semiconductor memory device can be achieved.

[Current Adjustment Sequence]

Figure 11:
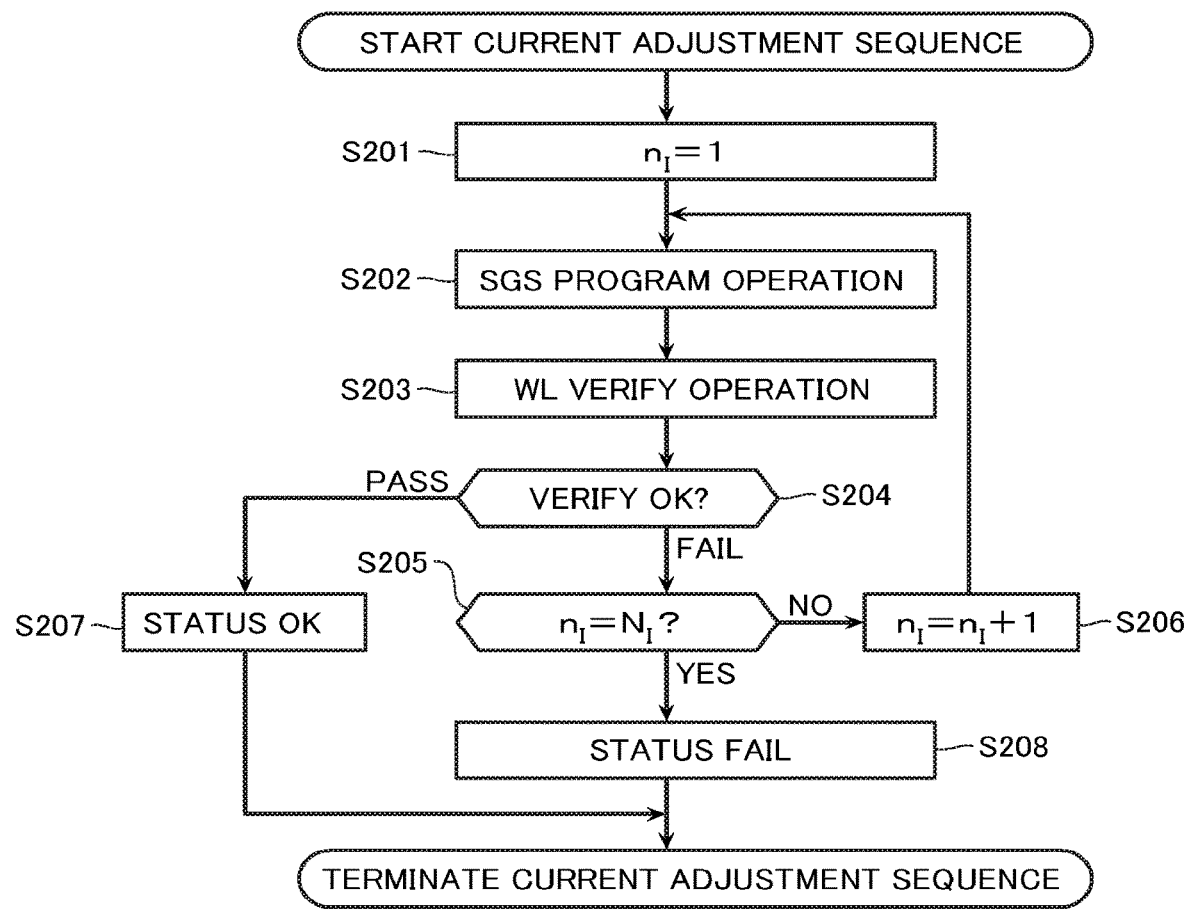
FIG. 11 is a schematic flowchart for describing a current adjustment sequence according to the first embodiment.
Figure 12:
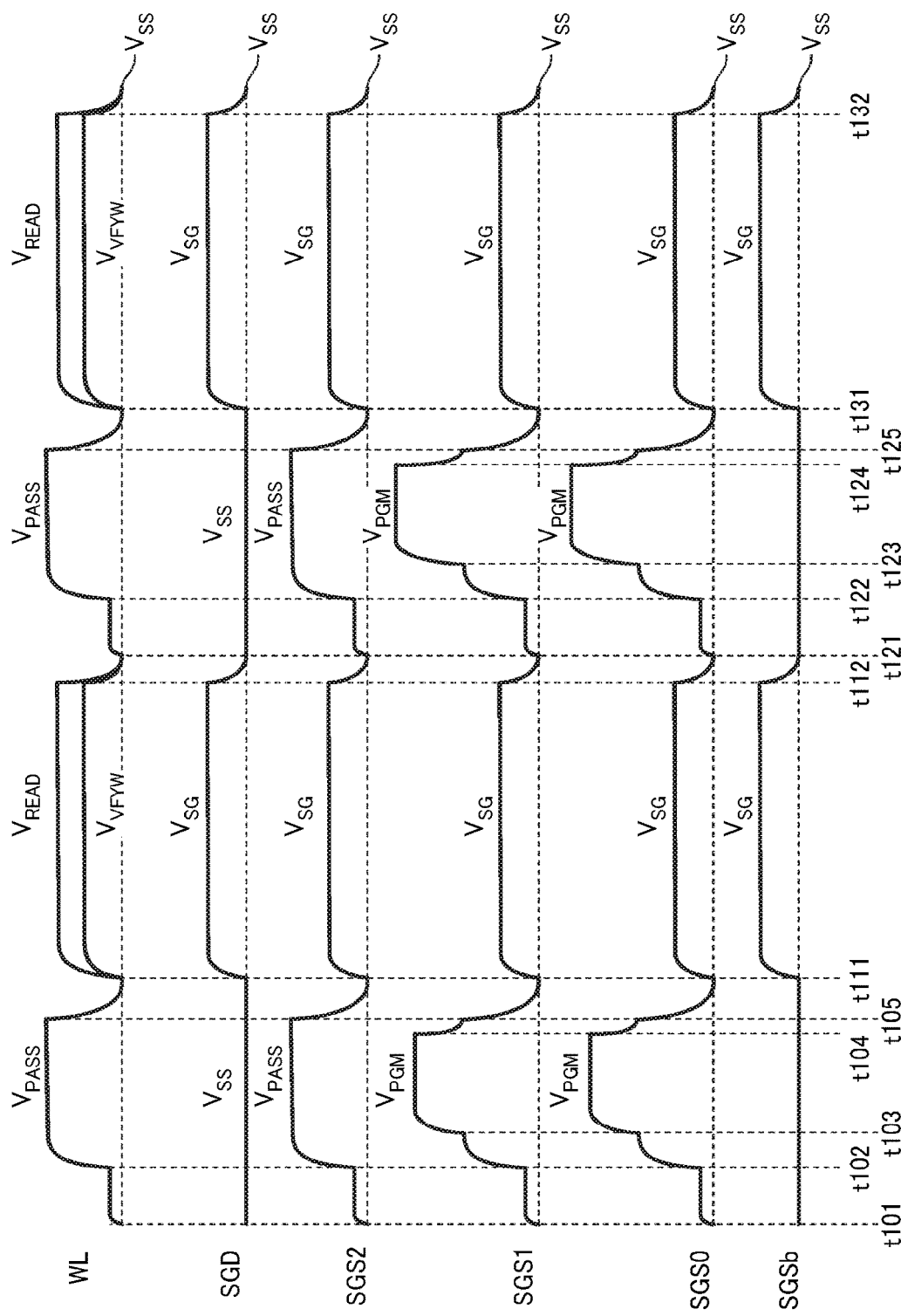
FIG. 12 is a schematic waveform diagram for describing the current adjustment sequence.
Figure 13:
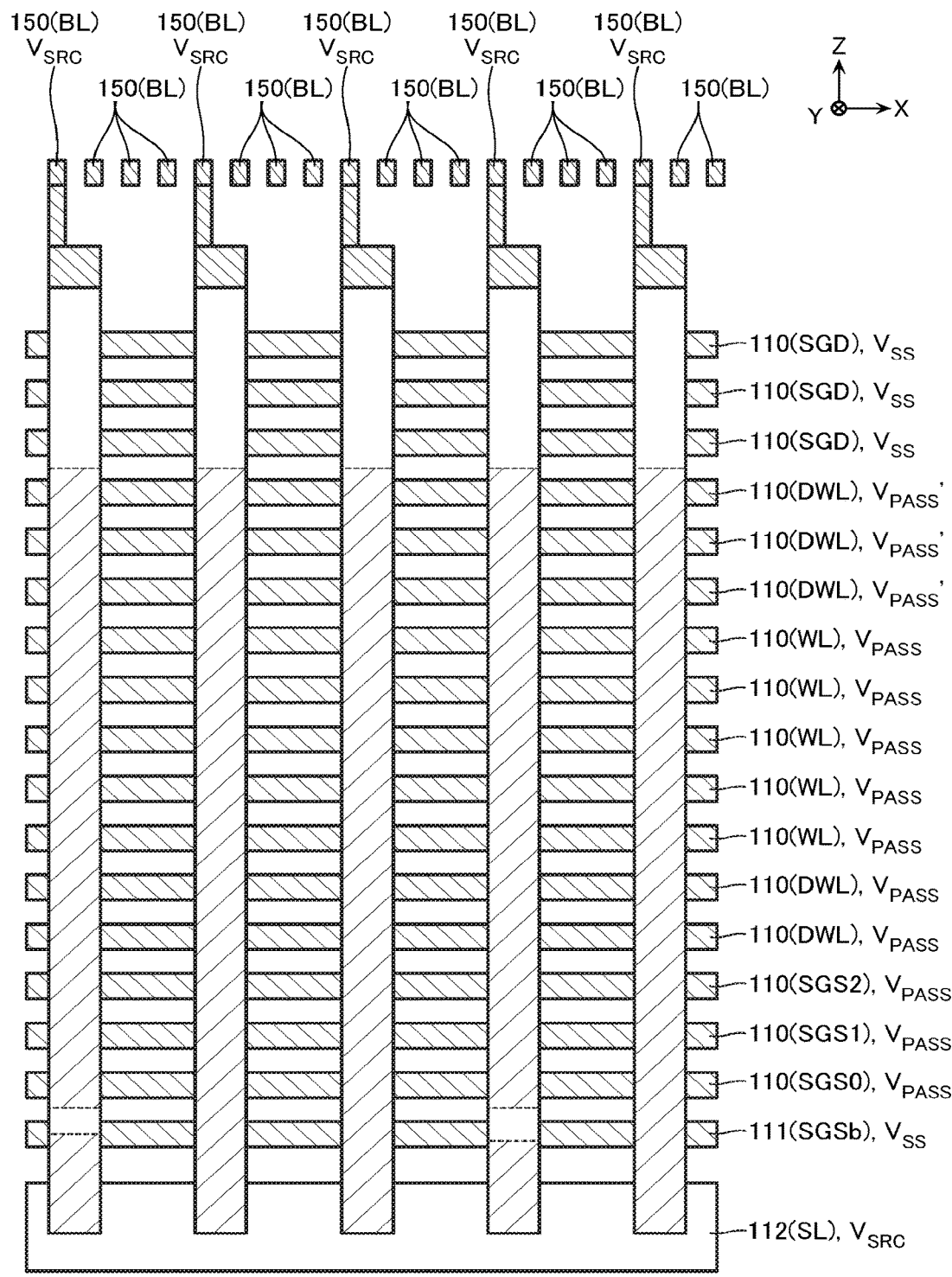
FIG. 13 is a schematic cross-sectional view for describing a SGS program operation.
Figure 14:
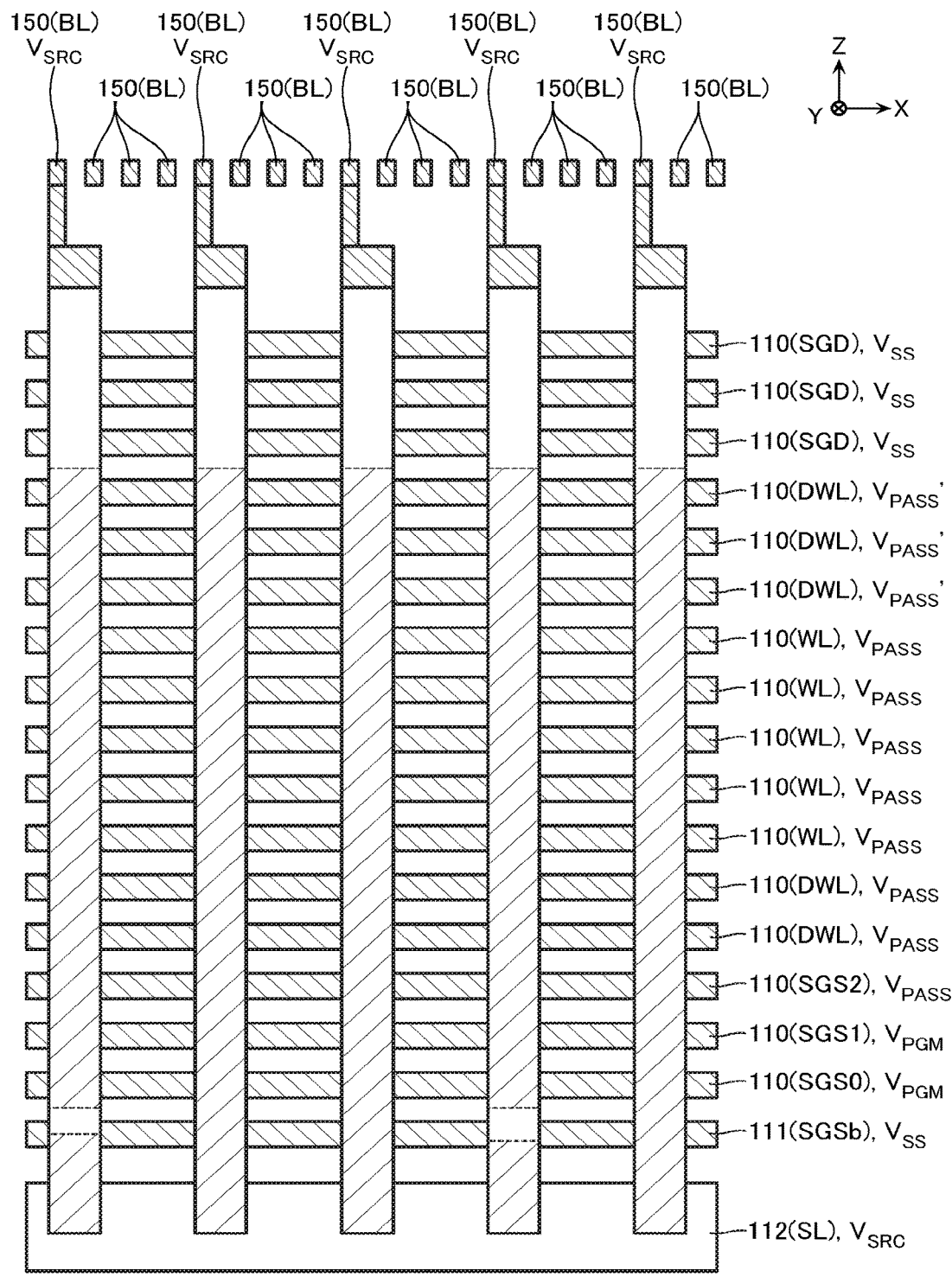
FIG. 14 is a schematic cross-sectional view for describing the SGS program operation.
Figure 15:
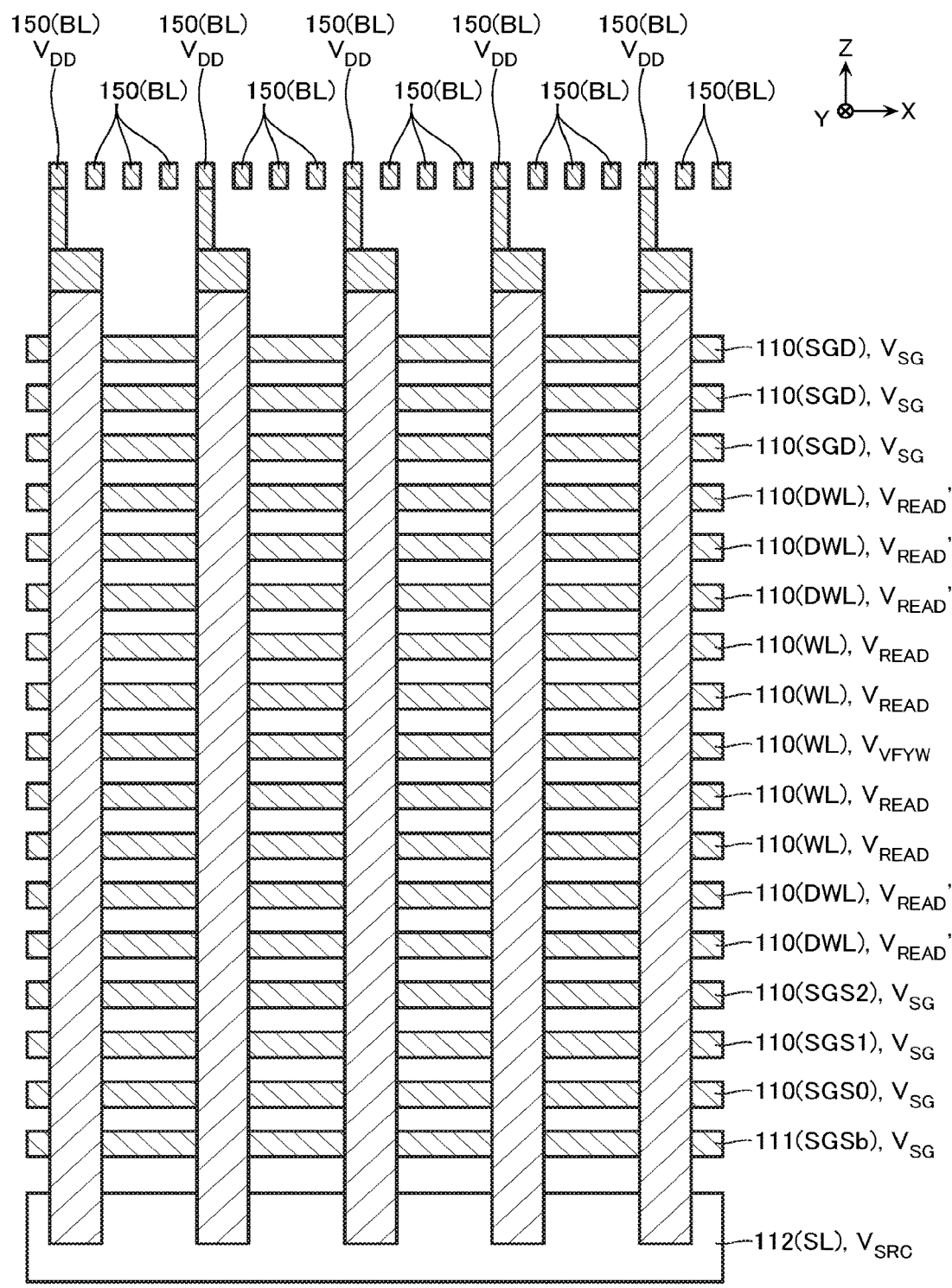
FIG. 15 is a schematic cross-sectional view for describing a WL verify operation.

Next, with reference to FIGS. 11 to 15, the current adjustment sequence of the semiconductor memory device according to the embodiment is described. FIG. 11 is a schematic flowchart for describing the current adjustment sequence. FIG. 12 is a schematic waveform diagram for describing the current adjustment sequence according to the embodiment. FIG. 13 and FIG. 14 are schematic cross-sectional views for describing an SGS program operation included in the current adjustment sequence. FIG. 15 is a schematic cross-sectional view for describing a WL verify operation included in the current adjustment sequence.

In the following description, among the plurality of conductive layers 110 arranged in the Z-direction, an example in which three conductive layers 110 positioned at the lowermost part function as the source side select gate line SGS is described. In the following description, the configuration corresponding to the conductive layer 110 positioned at the lowermost part is sometimes referred to as a source side select gate line SGS0, the configuration corresponding to the conductive layer 110 positioned second from the lowermost part as a source side select gate line SGS1, and the configuration corresponding to the conductive layer 110 positioned third from the lowermost part as a source side select gate line SGS2.

At Step S201 (FIG. 11), a loop count $n_I$ is set to 1. The loop count $n_I$ is recorded in the register or the like.

At Step S202 (FIG. 11), the SGS program operation is performed.

For example, in an example in FIG. 12, at timing t101, the SGS program operation is started.

At timing t102, the word lines WL are supplied with the write pass voltage $V_{PASS}$. The drain side select gate line SGD is supplied with the ground voltage $V_{SS}$. The source side select gate lines SGS2, SGS1, and SGS0 are supplied with the write pass voltage $V_{PASS}$. The source side select gate line SGSb is supplied with the ground voltage $V_{SS}$. As shown in FIG. 13, the source line SL is supplied with the voltage $V_{SRC}$. The dummy word line DWL on the source line SL side is supplied with the write pass voltage $V_{PASS}$. The dummy word line DWL on the bit line BL side is supplied with the voltage $V_{PASS}'$.

Here, in the example in FIG. 13, some source-side select transistors STSb are turned ON and the channels of electrons formed on the outer peripheral surfaces of some semiconductor layers 120 correspond to them are electrically conducted with the conductive layer 112. Some source-side select transistors STSb are turned OFF and the channels of electrons formed on the outer peripheral surfaces of some semiconductor layers 120 correspond to them are electrically separated from the conductive layer 112. Such phenomenon occurs, for example, due to the variation in the rage of the impurity region 122 described above.

At timing t103, as shown in FIG. 12, the source side select gate lines SGS0 and SGS1 are supplied with the program voltage $V_{PGM}$.

Here, as shown in FIG. 14, the channels of electrons formed on the outer peripheral surfaces of the semiconductor layers 120 corresponding to the source-side select transistors STSb in the ON state, are electrically conducted with the source line SL and are supplied with the voltage $V_{SRC}$. Consequently, a potential difference with a magnitude about the program voltage $V_{PGM}$ occurs between these channels and the source side select gate lines SGS0 and SCSI. Thus, the electrons are accumulated in the electric charge accumulating films 132 included in the gate insulating film 130 of the source-side select transistors STS, and the threshold voltages of these source-side select transistors STS increase.

Meanwhile, as shown in FIG. 14, the channels of electrons formed on the outer peripheral surfaces of the semiconductor layers 120 corresponding to the source-side select transistors STSb in the OFF state, are electrically separated from the source line SL, and are in a floating state. The voltage of these channels has a magnitude about the write pass voltage $V_{PASS}$ by capacitive coupling with the word line WL. Consequently, a potential difference with a magnitude about a difference between the program voltage $V_{PGM}$ and the write pass voltage $V_{PASS}$ occurs between these channels and the source side select gate lines SGS0 and SGS1. The threshold voltages of such source-side select transistors STS do not increase.

At timing t104, as shown in FIG. 12, the source side select gate lines SGS0 and SGS1 are supplied with the write pass voltage $V_{PASS}$.

At timing t105, the word line WL and the select gate lines (SGD, SGS2, SGS1, SGS0, SGSb) are supplied with the ground voltage $V_{SS}$.

At Step S203 (FIG. 11), the WL verify operation is performed.

For example, in the example in FIG. 12, at timing t111, the WL verify operation is started.

At timing t111, one or a plurality of word lines WL are supplied with a voltage $V_{VFYW}$. The voltage $V_{VFYW}$ may be smaller than the read pass voltage $V_{READ}$. The other word lines WL are supplied with the read pass voltage $V_{READ}$. The drain side select gate line SGD and the source side select gate lines SGS2, SGS1, SGS0, and SGSb are supplied with the voltage $V_{SG}$. As shown in FIG. 15, the bit lines BL are supplied with the voltage $V_{DD}$. The source line SL is supplied with the voltage $V_{SRC}$. The voltage $V_{SRC}$ is, for example, smaller than the voltage $V_{VFYW}$. The dummy word lines DWL on the source line SL side and the bit line BL side are supplied with the $V_{READ}'$.

From timing t111 to timing t112, it is detected whether the current flowing in the channels of electrons formed on the outer peripheral surfaces of the semiconductor layers 120 are equal to or less than the predetermined magnitude or not and the data indicating the magnitude of the current is obtained. This is performed, for example, by a method similar to the method of detecting the ON state/OFF state of the memory cell MC.

At timing t112, as shown in FIG. 12, the word line WL and the select gate lines (SGD, SGS2, SGS1, SGS0, SGSb) are supplied with the ground voltage $V_{SS}$.

At Step S204 (FIG. 11), results of the WL verify operation is determined. For example, when the data indicative of the magnitude of the current contains "L" equal to or more than a certain level, or the like, it is determined that WL verification has failed, and the process proceeds to Step S205. On the other hand, when the data indicative of the magnitude of the current does not contain "L" equal to or more than a certain level, or the like, it is determined that WL verification has passed, and the process proceeds to Step S207.

At Step S205, it is determined whether the loop count $n_1$ has reached a predetermined count $N_I$ or not. When the loop count $n_1$ has not reached the count $N_I$, the process proceeds to Step S206. When the loop count $n_1$ has reached the count $N_I$, the process proceeds to Step S208.

At Step S206, 1 is added to the loop count $n_1$, the process proceeds to Step S202. For example, in the example in FIG. 12, at timing t121 to timing t132, operations corresponding to timing t101 to timing t112 are performed. At Step S206, for example, a predetermined voltage ΔV is added to the program voltage $V_{PGM}$. Consequently, as shown in FIG. 12, the program voltage $V_{PGM}$ supplied to the source side select gate lines SGS1 and SGS0 at timing t123 is larger than the program voltage $V_{PGM}$ supplied to the source side select gate lines SGS1 and SGS0 at timing t103.

At Step S207, the status data $D_{ST}$ indicating that the current adjustment sequence has normally terminated is stored into the status register STR (FIG. 1) and the current adjustment sequence is terminated.

At Step S208, the status data $D_{ST}$ indicating that the current adjustment sequence has not normally terminated is stored into the status register STR (FIG. 1) and the current adjustment sequence is terminated.

Second Embodiment

Figure 16:
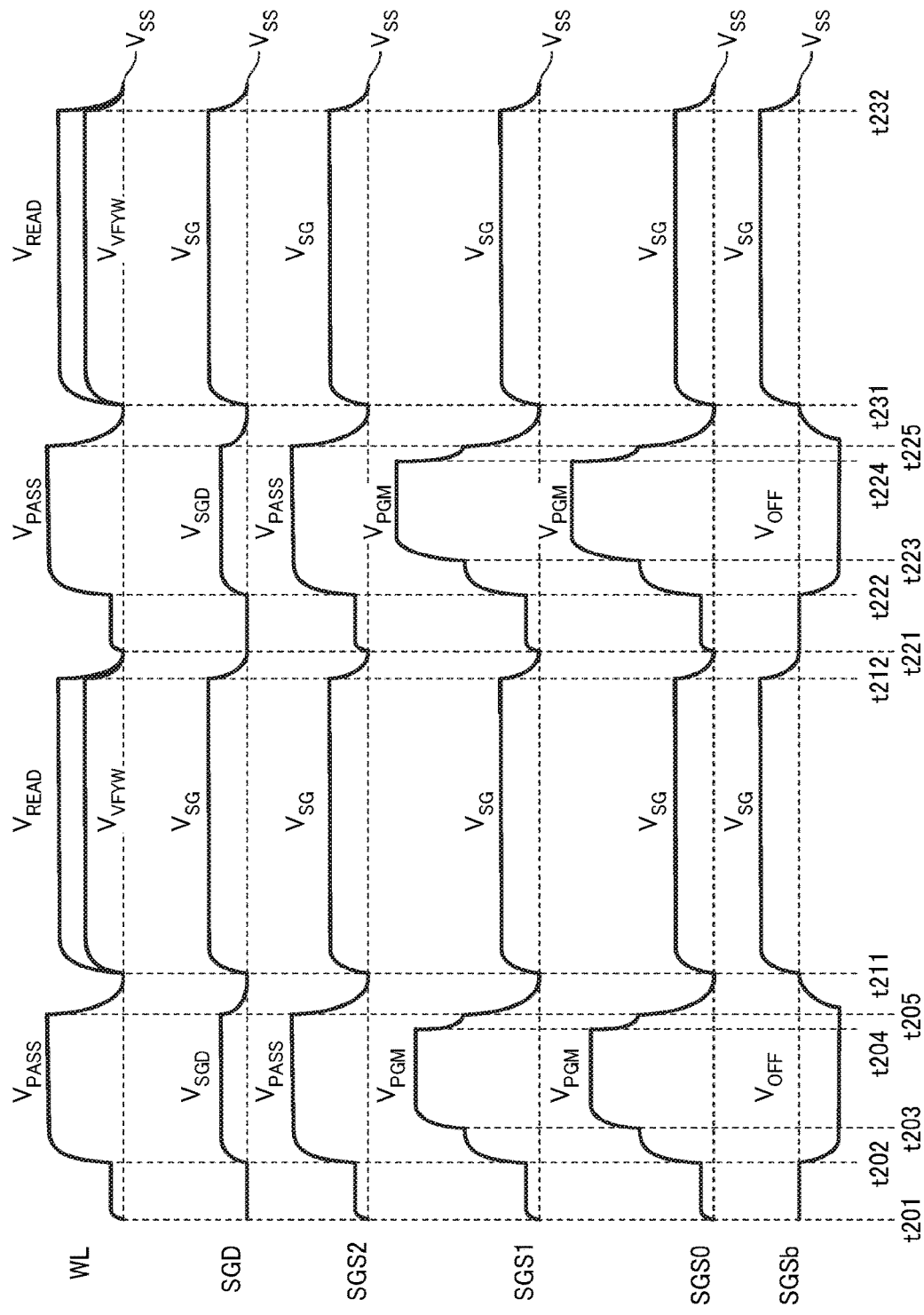
FIG. 16 is a schematic waveform diagram for describing a current adjustment sequence according to a second embodiment.
Figure 17:
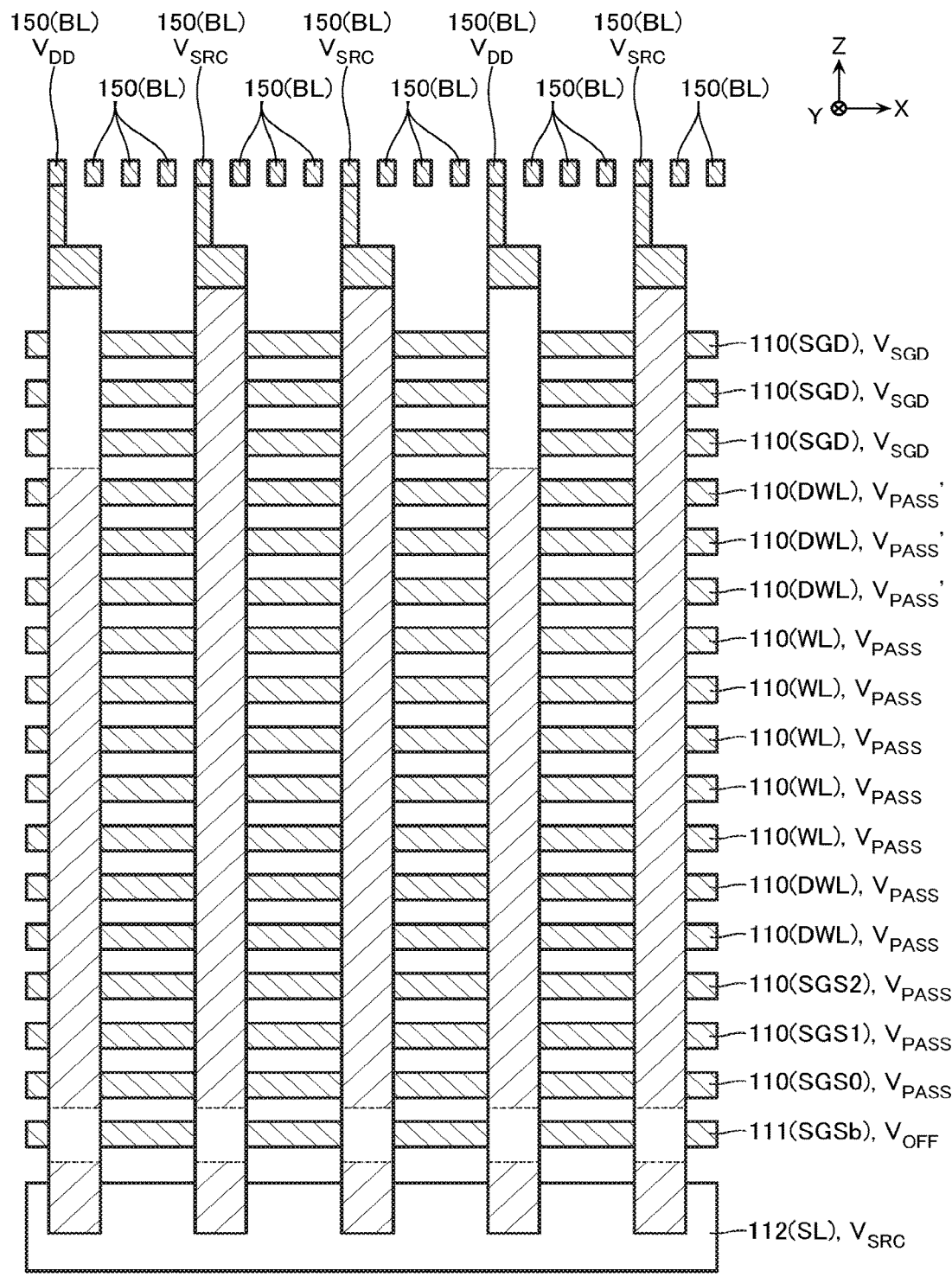
FIG. 17 is a schematic cross-sectional view for describing a SGS program operation.
Figure 18:
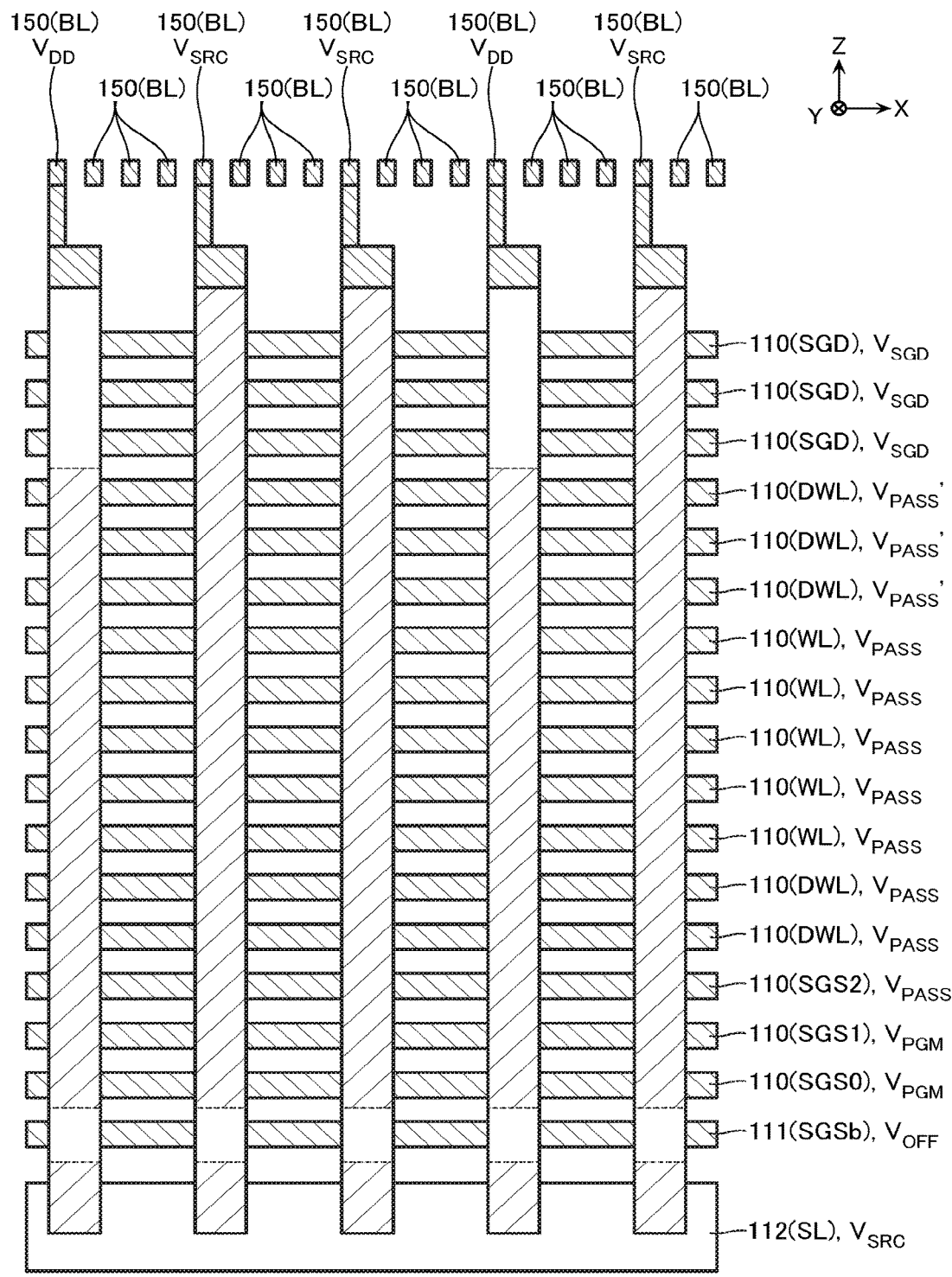
FIG. 18 is a schematic cross-sectional view for describing the SGS program operation.

Next, with reference to FIGS. 16 to 18, a current adjustment sequence of a semiconductor memory device according to the second embodiment is described. FIG. 16 is a schematic waveform diagram for describing the current adjustment sequence. FIG. 17 and FIG. 18 are schematic cross-sectional views for describing a SGS program operation included in the current adjustment sequence.

The current adjustment sequence according to the second embodiment is, basically, performed similarly to the current adjustment sequence according to the first embodiment. However, the current adjustment sequence according to the second embodiment is partially different from the current adjustment sequence according to the first embodiment.

That is, in the current adjustment sequence according to the first embodiment, the source-side select transistor STS that is a target for the SGS program operation is selected corresponding to the variation of the range of the impurity region 122.

On the other hand, in the current adjustment sequence according to the second embodiment, the source-side select transistor STS that is a target for the SGS program operation is selected by adjustment of the voltage of the bit line BL. In this case, to set the source-side select transistor STSb to the OFF state regardless of the variation of the range of the impurity region 122, the source side select gate line SGSb is supplied with the voltage $V_{OFF}$ with a negative polarity.

In the following, the current adjustment sequence according to the second embodiment is more specifically described.

For example, in the example in FIG. 16, at timing t201, the SGS program operation is started. Here, in the SGS program operation according to the embodiment, for example, the bit lines BL connected to the selected source-side select transistors STS whose threshold voltages are to be adjusted (hereinafter sometimes referred to as "write select transistor") are supplied with the voltage $V_{SRC}$, and, the bit lines BL connected to the selected source-side select transistors STS whose threshold voltages are not to be adjusted (hereinafter sometimes referred to as "select-inhibited transistor") are supplied with the voltage $V_{DD}$. For example, among the controlling latch circuits connected to the voltage transfer circuits in the sense amplifier module SAM, the ones corresponding to the write select transistors are caused to latch "L", and the ones corresponding to the select-inhibited transistors are caused to latch "H." Via the two voltage supply lines, the write select transistors and the select-inhibited transistors are supplied with the different voltages.

At timing t202, the word lines WL are supplied with the write pass voltage $V_{PASS}$. The drain side select gate line SGD is supplied with the voltage $V_{SGD}$. The source side select gate lines SGS2, SGS1, and SGS0 are supplied with the write pass voltage $V_{PASS}$. The source side select gate line SGSb is supplied with the voltage $V_{OFF}$ with the negative polarity smaller than the ground voltage $V_{SS}$. As shown in FIG. 17, the dummy word lines DWL on the bit line BL side are supplied with the $V_{PASS}$.' The dummy word lines DWL on the source line SL side are supplied with the write pass voltage $V_{PASS}$.

At timing t203, as shown in FIG. 16 and FIG. 18, the source side select gate lines SGS0 and SGS1 are supplied with the program voltage $V_{PGM}$. Thus, the electrons are accumulated in the electric charge accumulating films 132 of the write select transistors, and the threshold voltages of the write select transistors increases.

At timing t204, as shown in FIG. 16, the source side select gate lines SGS0 and SGS1 are supplied with the write pass voltage $V_{PASS}$.

At timing t205, the word lines WL and the select gate lines (SGD, SGS2, SGS1, SGS0, SGSb) are supplied with the ground voltage V.

At timing t211 to timing t212, a WL verify operation is performed. The WL verify operation is performed similarly to the WL verify operation according to the first embodiment. However, in the second embodiment, corresponding to the data indicating the magnitude of the current obtained in the WL verify operation, some write select transistors are updated to the select-inhibited transistor.

The other operations are performed similarly to the operations in the current adjustment sequence according to the first embodiment.

Third Embodiment

Figure 19:
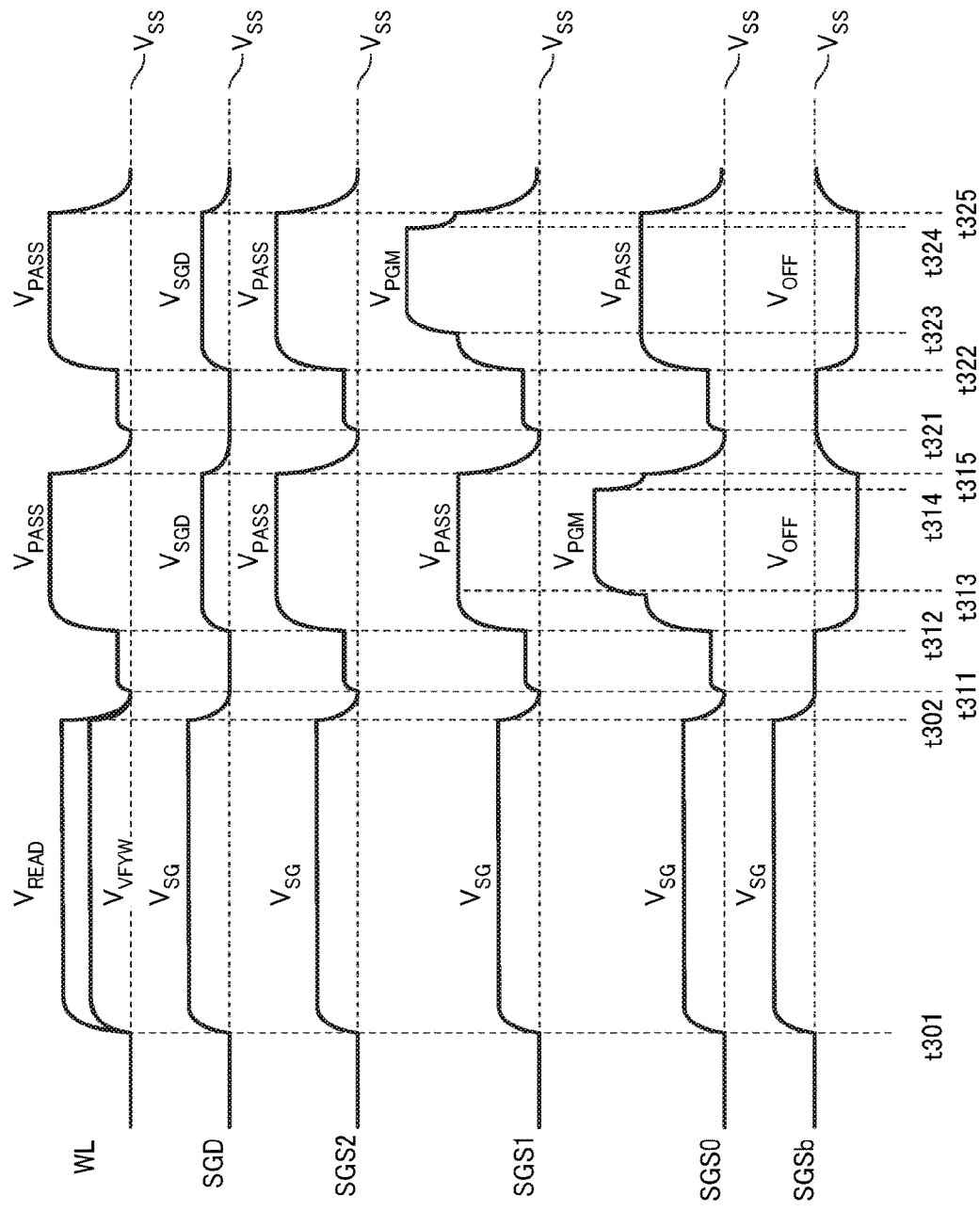
FIG. 19 is a schematic waveform diagram for describing a current adjustment sequence according to a third embodiment.
Figure 20:
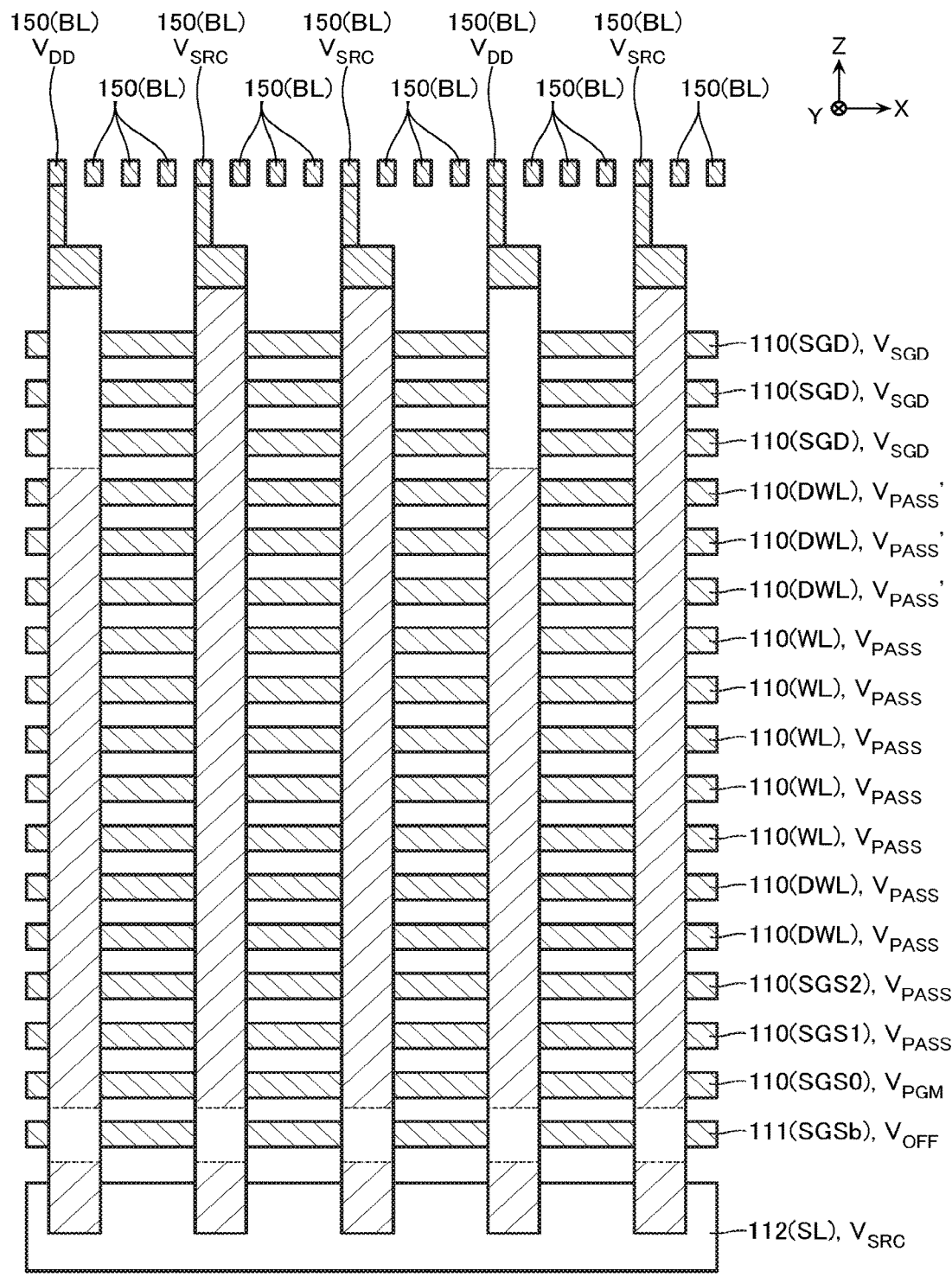
FIG. 20 is a schematic cross-sectional view for describing a SGS program operation.
Figure 21:
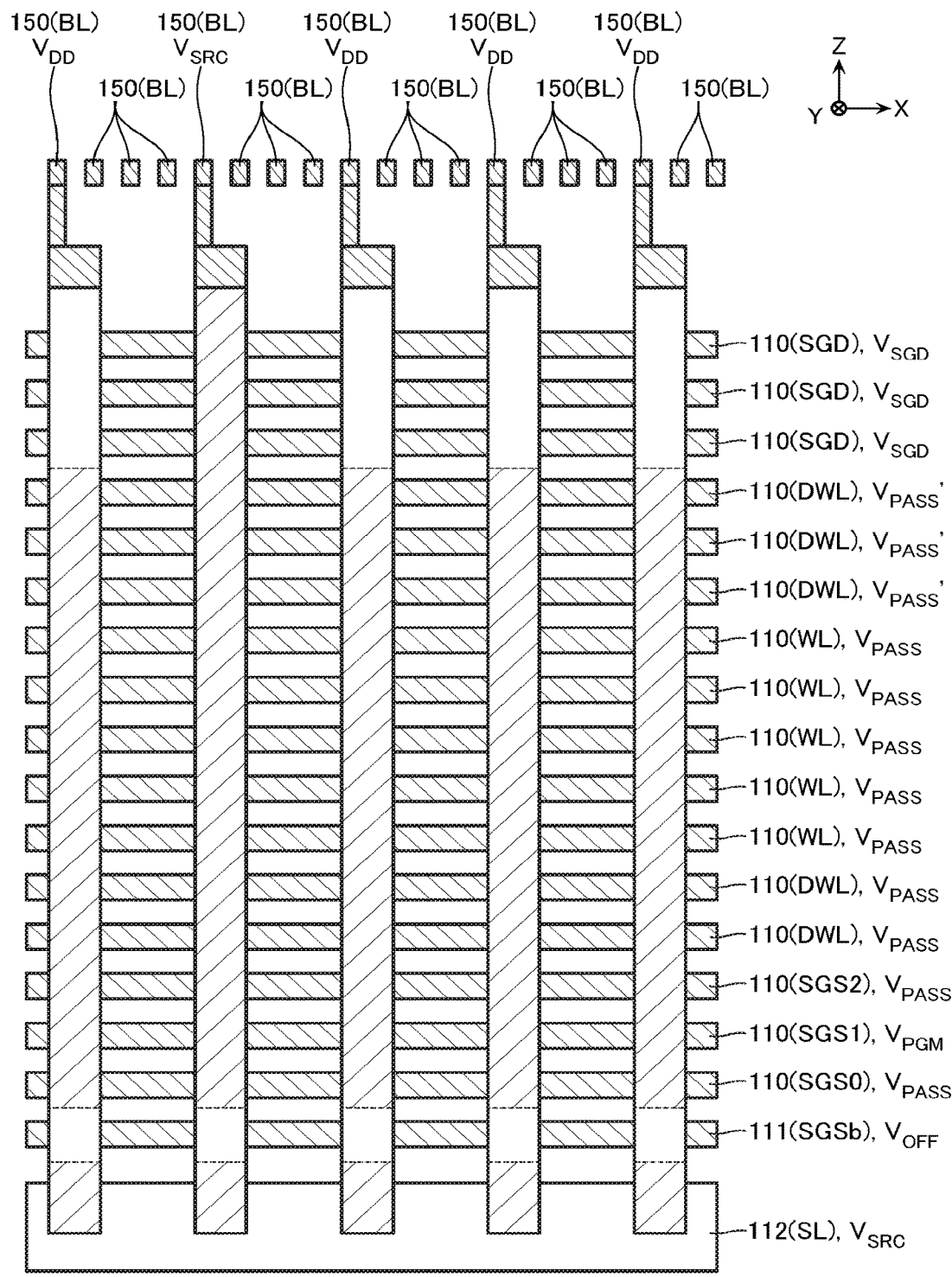
FIG. 21 is a schematic cross-sectional view for describing the SGS program operation.

Next, with reference to FIG. 19 to FIG. 21, a current adjustment sequence of a semiconductor memory device according to the third embodiment is described. FIG. 19 is a schematic waveform diagram for describing the current adjustment sequence. FIG. 20 and FIG. 21 are schematic cross-sectional views for describing a SGS program operation included in the current adjustment sequence.

The current adjustment sequence according to the third embodiment is basically performed similarly to the current adjustment sequence according to the second embodiment. However, the current adjustment sequence according to the third embodiment is partially different from the current adjustment sequence according to the second embodiment.

That is, in the current adjustment sequence according to the second embodiment, for example, as described with reference to FIG. 16 and FIG. 18, the source side select gate lines SGS0 and SGS1 were simultaneously supplied with the program voltage $V_{PGM}$, at timing t203 or the like in the SGS program operation, with the bit lines BL corresponding to all the write select transistors supplied with the voltage $V_{SRC}$.

On the other hand, in the current adjustment sequence according to the third embodiment, for example, as shown in FIG. 19 and FIG. 20, the source side select gate line SGS0 is supplied with the program voltage $V_{PGM}$ at timing t313, with the bit lines BL corresponding to all the write select transistors supplied with the voltage $V_{SRC}$. For example, as shown in FIG. 19 and FIG. 21, the source side select gate line SGS1 is supplied with the program voltage $V_{PGM}$ at timing t323, with the bit lines BL corresponding to some write select transistors supplied with the voltage $V_{SRC}$.

In the following, the current adjustment sequence according to the third embodiment is more specifically described.

For example, in an example in FIG. 19, the WL verify operation is performed at timing t301 to timing t302. The WL verify operation is performed similarly to the WL verify operation according to the second embodiment. However, in the third embodiment, in the WL verify operation, data indicative of the magnitude of the current is acquired twice. When the data indicative of the magnitude of the current is acquired, a discharge time of the sense node in the sense amplifier module SAM (FIG. 1, FIG. 2) is made different between a first time and a second time. Thus, data indicating whether the current flowing in the respective semiconductor layers 120 is larger than a first target value or not and data indicating whether the current flowing in the respective semiconductor layers 120 is larger than a second target value or not are obtained. The second target value is, for example, larger than the first target value.

At timing t311, the SGS program operation is started. Here, in the SGS program operation according to the embodiment, for example, the bit lines BL connected to the selected source-side select transistors STS in which the current that flowed in the WL verify operation was larger than the first target value and smaller than the second target value (hereinafter sometimes referred to as "first write select transistor") and the selected source-side select transistors STS in which the current was larger than the second target value (hereinafter sometimes referred to as "second write select transistor") are supplied with the voltage $V_{SRC}$. The bit lines BL connected to the selected source-side select transistors STS in which the current that flowed in the WL verify operation was smaller than the first target value (hereinafter sometimes referred to as "select-inhibited transistor") are supplied with the voltage $V_{DD}$.

At timing t312, the word lines WL are supplied with the write pass voltage $V_{PASS}$. The drain side select gate line SGD is supplied with the voltage $V_{SGD}$. The source side select gate lines SGS2, SGS1, and SGS0 are supplied with the write pass voltage $V_{PASS}$. The source side select gate line SGSb is supplied with the voltage $V_{OFF}$. As shown in FIG. 20, the dummy word lines DWL on the bit line BL side are supplied with the voltage $V_{PASS}'$. The dummy word lines DWL on the source line SL side are supplied with the write pass voltage $V_{PASS}$.

At timing t313, as shown in FIG. 19, the source side select gate line SGS0 is supplied with the program voltage $V_{PGM}$. Thus, the electrons are accumulated in the electric charge accumulating films 132 of the first write select transistors and the second write select transistors and the threshold voltages of the first write select transistors and the second write select transistors increase.

At timing t314, as shown in FIG. 19, the source side select gate line SGS0 is supplied with the write pass voltage $V_{PASS}$.

At timing t315, the word line WL and select gate lines (SGD, SGS2, SGS1, SGS0, SGSb) are supplied with the ground voltage $V_{SS}$.

At timing t321, the bit lines BL connected to the second write select transistors are supplied with the voltage $V_{SRC}$. The bit lines BL connected to the first write select transistors and the select-inhibited transistors are supplied with the voltage $V_{DD}$.

At timing t322, the word lines WL are supplied with the write pass voltage $V_{PASS}$. The drain side select gate line SGD is supplied with the voltage $V_{SGD}$. The source side select gate lines SGS2, SGS1, and SGS0 are supplied with the write pass voltage $V_{PASS}$. The source side select gate line SGSb is supplied with the voltage $V_{OFF}$. As shown in FIG. 21, the dummy word lines DWL on the bit line BL side are supplied with the voltage $V_{PASS}'$. The dummy word lines DWL on the source line SL side are supplied with the write pass voltage $V_{PASS}$.

At timing t323, as shown in FIG. 19, the source side select gate line SGS1 is supplied with the program voltage $V_{PGM}$. Thus, the electrons are accumulated in the electric charge accumulating films 132 of the second write select transistors, and the threshold voltages of the second write select transistors increase.

At timing t324, as shown in FIG. 19, the source side select gate line SCSI is supplied with the write pass voltage $V_{PASS}$.

At timing t325, the word line WL and select gate lines (SGD, SGS2, SGS1, SGS0, SGSb) are supplied with the ground voltage $V_{SS}$.

Fourth Embodiment

Figure 22:
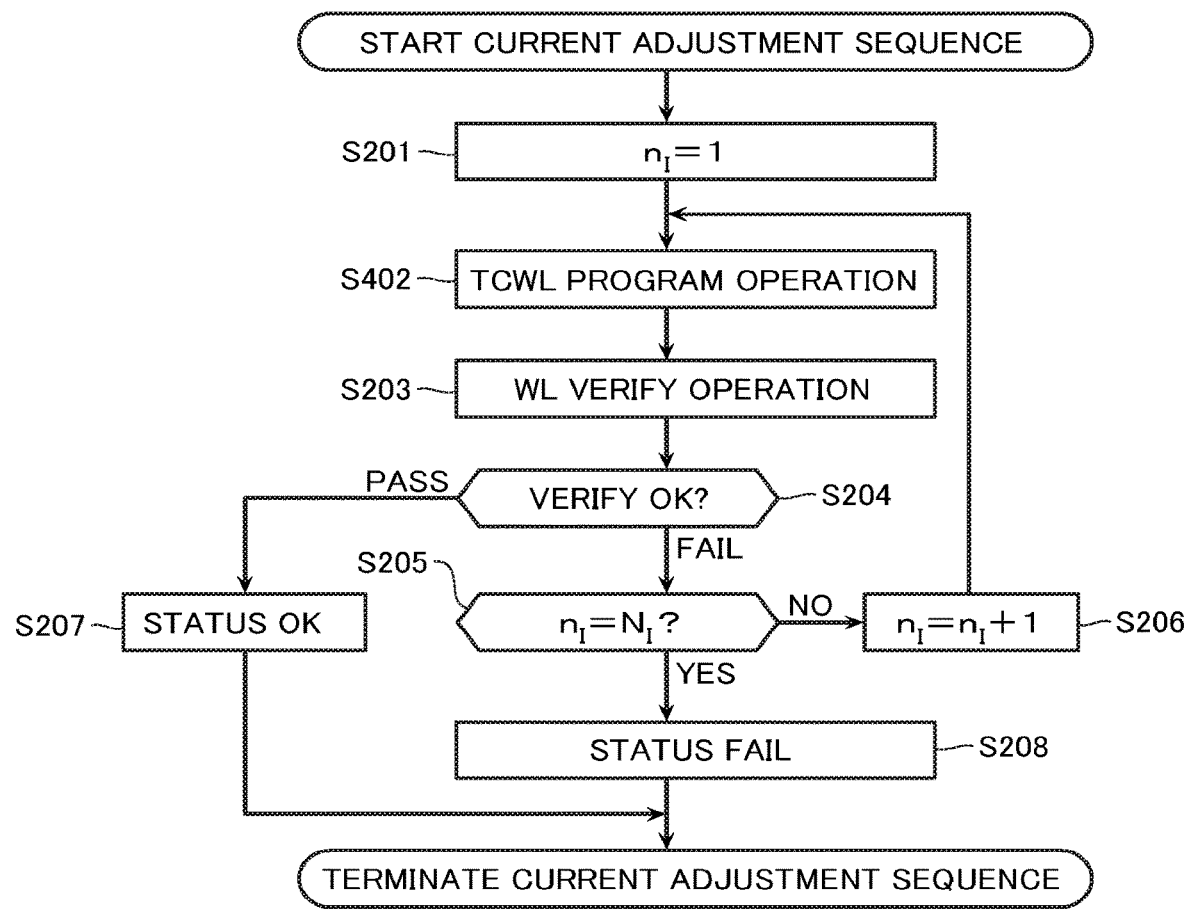
FIG. 22 is a schematic flowchart for describing a current adjustment sequence according to the fourth embodiment.
Figure 23:
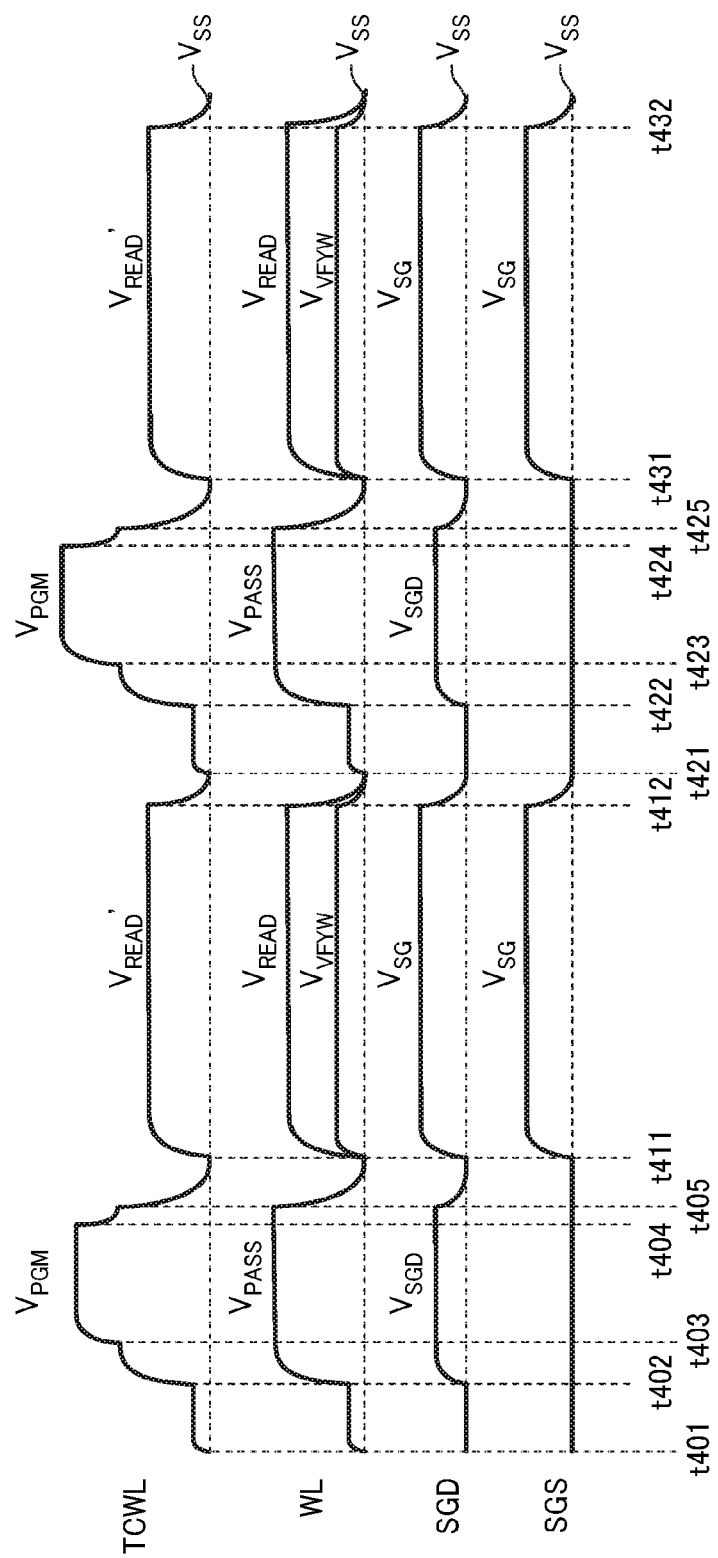
FIG. 23 is a schematic waveform diagram for describing the current adjustment sequence.
Figure 24:
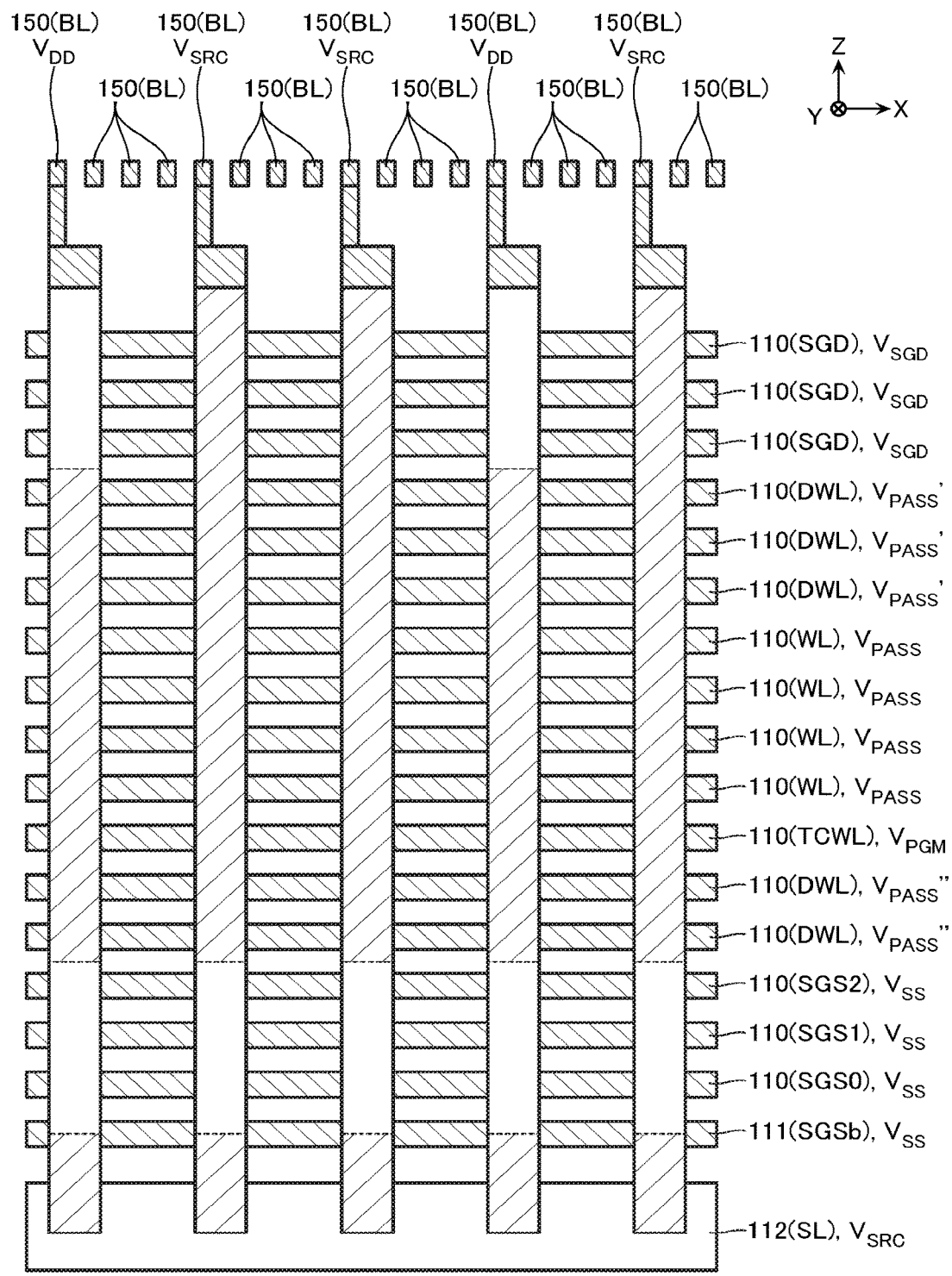
FIG. 24 is a schematic cross-sectional view for describing a TCWL program operation.
Figure 25:
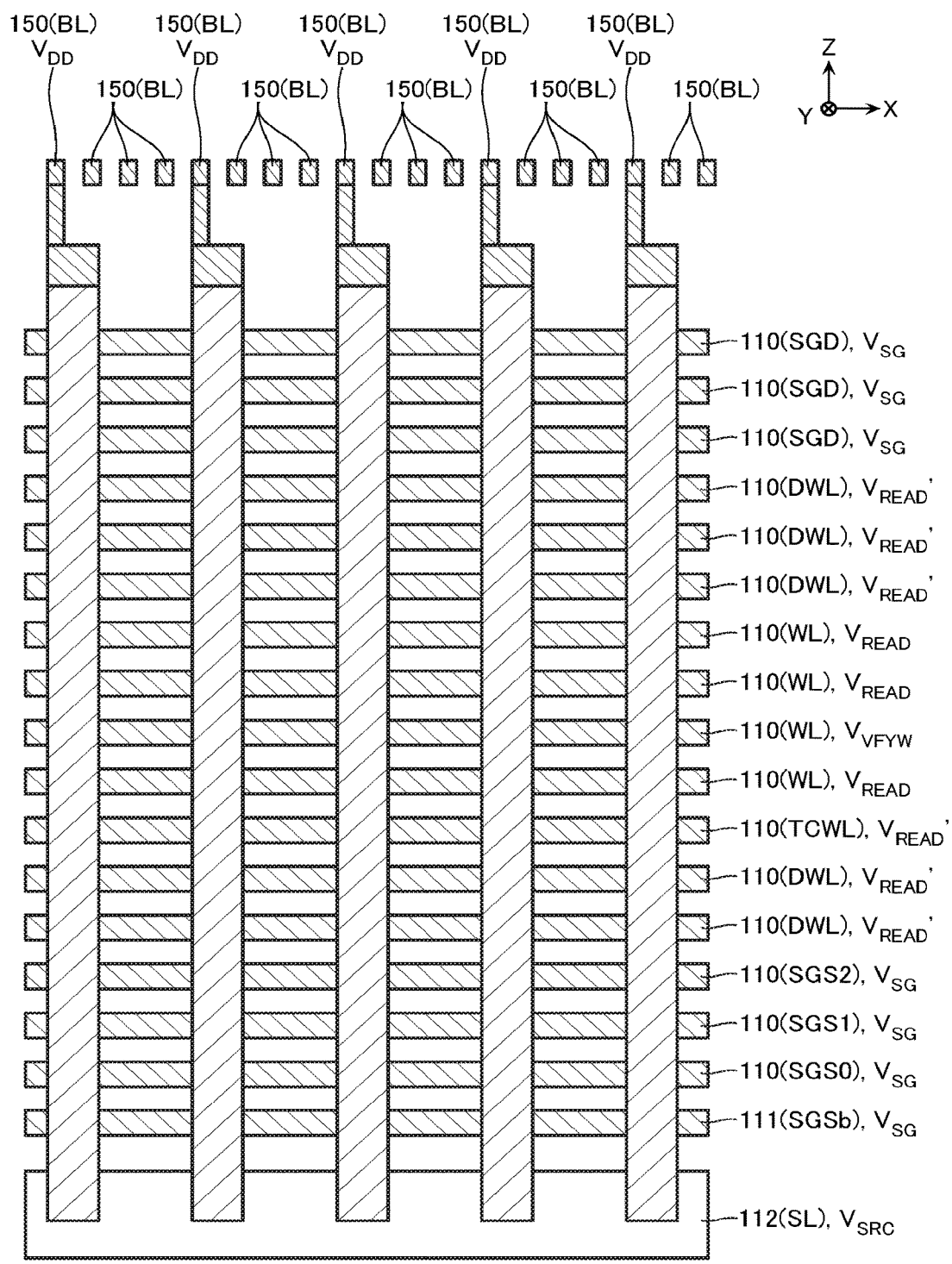
FIG. 25 is a schematic cross-sectional view for describing a WL verify operation.

Next, with reference to FIG. 22 to FIG. 25, a current adjustment sequence of a semiconductor memory device according to the fourth embodiment is described. FIG. 22 is a schematic flowchart for describing the current adjustment sequence. FIG. 23 is a schematic waveform diagram for describing the current adjustment sequence. FIG. 24 is a schematic cross-sectional view for describing a TCWL program operation included in the current adjustment sequence. FIG. 25 is a schematic cross-sectional view for describing a WL verify operation included in the current adjustment sequence.

The current adjustment sequence according to the fourth embodiment is basically performed similarly to the current adjustment sequence according to the second embodiment. However, the current adjustment sequence according to the fourth embodiment is partially different from the current adjustment sequence according to the second embodiment.

That is, in the current adjustment sequence according to the second embodiment, the variation of the current between the semiconductor layers 120 is reduced by adjusting the threshold voltages of the source-side select transistors STS. However, such method is merely an example and a specific method, and the like are adjustable as necessary. For example, to reduce the variation of the current between the semiconductor layers 120, the threshold voltages of the drain-side select transistors STD may be adjusted and the threshold voltages of the dummy memory cells DMC on the source line SL side or the bit line BL side may be adjusted. Any of the plurality of memory cells MC may be used for reducing the variation of the current between the semiconductor layers 120, not for recording the data. In the following, such memory cell MC is sometimes referred to as "threshold-voltage-adjustment memory cell." The word line WL connected to such memory cell MC is sometimes referred to as "threshold-voltage-adjustment word line TCWL."

For example, in the fourth embodiment, an example where, among the plurality of memory cells MC arranged in the Z-direction, the one positioned closest to the source line SL side (the one adjacent to the dummy memory cell DMC on the source line SL side) is used as the threshold-voltage-adjustment memory cell is described.

In the following, the current adjustment sequence according to the fourth embodiment is more specifically described.

As shown in FIG. 22, the current adjustment sequence according to the fourth embodiment is basically performed similarly to the current adjustment sequence according to the second embodiment. However, in the fourth embodiment, the TCWL program operation (Step S402) is performed instead of the SGS program operation.

For example, in an example in FIG. 23, at timing t401, the TCWL program operation is started. Here, in the TCWL program operation according to the embodiment, for example, the bit lines BL connected to the threshold-voltage-adjustment memory cells whose threshold voltages are to be adjusted (hereinafter sometimes referred to as "write adjustment memory cell") are supplied with the voltage $V_{SRC}$, and, the bit lines BL connected to the threshold-voltage-adjustment memory cells whose threshold voltages are not to be adjusted (hereinafter sometimes referred to as "adjustment-inhibited memory cell") are supplied with the voltage $V_{DD}$. For example, among the controlling latch circuits connected to the voltage transfer circuits in the sense amplifier module SAM, the ones corresponding to the write adjustment memory cells are caused to latch "L," and the ones corresponding to the adjustment-inhibited memory cells are caused to latch "H." Via the two voltage supply lines, the write adjustment memory cells and the adjustment-inhibited memory cells are supplied with the different voltages.

At timing t402, the threshold-voltage-adjustment word line TCWL and other word lines WL are supplied with the write pass voltage $V_{PASS}$. The drain side select gate line SGD is supplied with the voltage $V_{SGD}$. The source side select gate line SGS is supplied with the ground voltage $V_{SS}$. As shown in FIG. 24, the dummy word lines DWL on the bit line BL side are supplied with the voltage $V_{PASS}'$. The dummy word lines DWL on the source line SL side are supplied with the voltage $V_{PASS}''$.

At timing t403, as shown in FIG. 23, the threshold-voltage-adjustment word line TCWL is supplied with the program voltage $V_{PGM}$. Thus, the electrons are accumulated in the electric charge accumulating films 132 of the write adjustment memory cells and the threshold voltages of the write adjustment memory cells increase.

At timing t404, as shown in FIG. 23, the threshold-voltage-adjustment word line TCWL is supplied with the write pass voltage $V_{PASS}$.

At timing t405, the threshold-voltage-adjustment word line TCWL, other word lines WL, and the select gate lines (SGD, SGS, SGSb) are supplied with the ground voltage V.

At timing t411 to timing t412, the WL verify operation is performed. The WL verify operation is performed similarly to the WL verify operation according to the second embodiment. However, in the fourth embodiment, as shown in FIG. 25, the threshold-voltage-adjustment word line TCWL is supplied with the voltage $V_{READ}'$, which is similarly supplied to the dummy word line DWL on the source line SL side. In the fourth embodiment, some write adjustment memory cells are updated to the adjustment-inhibited memory cell, corresponding to the data indicating the magnitude of the current obtained in the WL verify operation.

The other operations are performed similarly to the operations in the current adjustment sequence according to the second embodiment.

In the fourth embodiment, one of the plurality of memory cells MC arranged in the Z-direction was used as the threshold-voltage-adjustment memory cell. However, such method is merely an example, and a specific method and the like are adjustable as necessary. For example, two or more of the plurality of memory cells MC arranged in the Z-direction may be used as the threshold-voltage-adjustment memory cell.

In such case, for example, similar to the third embodiment, in the verify operation, data indicating whether the current flowing in each semiconductor layer 120 is larger than the first target value or not and data indicating whether the current flowing in each semiconductor layer 120 is larger than the second target value or not may be obtained. In the TCWL program operation, when a predetermined threshold-voltage-adjustment word line TCWL is supplied with the program voltage $V_{PGM}$ the bit lines BL connected to the write adjustment memory cells where the current that flowed in the WL verify operation was larger than the first target value and smaller than the second target value (hereinafter sometimes referred to as "first write adjustment memory cell") and the bit lines BL connected to the write adjustment memory cells where the current was larger than the second target value (hereinafter sometimes referred to as "second write adjustment memory cell") may be supplied with the voltage $V_{SRC}$, and other bit lines BL may be supplied with the voltage $V_{DD}$. When another threshold-voltage-adjustment word line TCWL is supplied with the program voltage $V_{PGM}$, the bit lines BL connected to the second write adjustment memory cells may be supplied with the voltage $V_{SRC}$, and the other bit lines BL may be supplied with the voltage $V_{DD}$.

Fifth Embodiment

Figure 26:
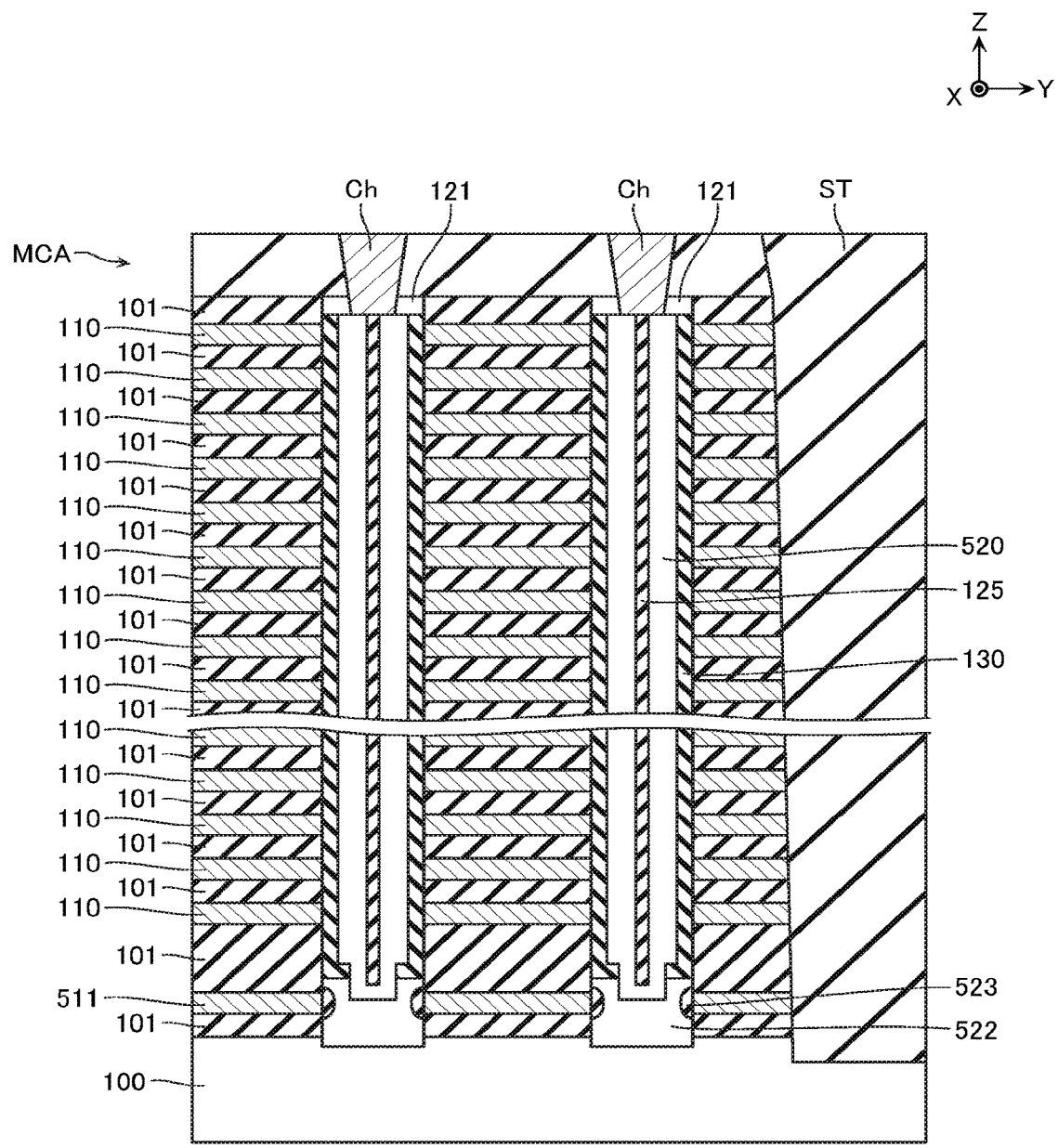
FIG. 26 is a schematic cross-sectional view illustrating a part of a configuration of a semiconductor memory device according to a fifth embodiment.

Next, with reference to FIG. 26, a current adjustment sequence of a semiconductor memory device according to the fifth embodiment is described. FIG. 26 is a schematic cross-sectional view indicating a part of the configuration of the semiconductor memory device according to the embodiment.

The semiconductor memory device according to the fifth embodiment is basically configured similarly to the semiconductor memory device according to the first embodiment to the fourth embodiment. However, the semiconductor memory device according to the fifth embodiment is partially different in configuration from the semiconductor memory device according to the first embodiment to the fourth embodiment.

For example, in the first embodiment to the fourth embodiment, as described with reference to, for example, FIG. 4 and the like, the conductive layer 111 functions as the source side select gate line SGSb was disposed below the plurality of conductive layers 110, and the conductive layer 112 functions as the source line SL was disposed below the conductive layer 111. However, such configuration is merely an example, and a specific configuration or the like is adjustable as necessary.

For example, in the example in FIG. 26, a conductive layer 511 is disposed below the plurality of conductive layers 110. The conductive layer 511 includes a stacked film of a barrier conductive film such as titanium nitride (TiN) and a metal film such as tungsten (W), or the like. The conductive layer 511 functions as the source side select gate line SGSb (FIG. 2) and the gate electrodes of the plurality of source-side select transistors STSb connected thereto.

In the example in FIG. 26, the semiconductor memory device includes a semiconductor layer 520 instead of the semiconductor layer 120. The semiconductor layer 520 is basically configured similarly to the semiconductor layer 120 according to the first embodiment to the fourth embodiment. However, the impurity region 122 is not connected in the lower end portion of the semiconductor layer 520.

In the example in FIG. 26, the lower end portion of the semiconductor layer 520 is connected to the P type well region of the semiconductor substrate 100, via a semiconductor layer 522 such as single-crystal silicon (Si). Between the semiconductor layer 522 and the conductive layer 511, an insulating film 523 such as silicon dioxide ($SiO_2$) is disposed.

Here, in such configuration, in a manufacturing process, a contact area between the lower end of the semiconductor layer 520 and the semiconductor layer 522 may vary. In association with this, the magnitude of the current may vary among the semiconductor layers 520.

Therefore, in the fifth embodiment, the current adjustment sequence according to any of the first embodiment to the fourth embodiment is performed. Thus, the variation of the current between the semiconductor layers 520 can be reduced.

OTHER EMBODIMENTS

The semiconductor memory device and the method for adjusting the operating conditions of the semiconductor memory device according to the first embodiment to the fifth embodiment have been described above. However, the explanations described above are merely examples and specific configurations, specific methods, and the like are adjustable as necessary.

For example, as illustrated with reference to FIG. 11, in the current adjustment sequence according to the first embodiment to the third embodiment, while the loop count $n_T$ is incremented, the SGS program operation and the WL verify operation were repeatedly performed. As illustrated with reference to FIG. 22, in the current adjustment sequence according to the fourth embodiment, while the loop count $n_I$ is incremented, the TCWL program operation and the WL verify operation were repeatedly performed. However, such operations are merely examples and specific methods are adjustable as necessary. For example, in the first embodiment to the fifth embodiment, the WL verify operation is performed only once, and after that, the SGS program operation or the TCWL program operation may be performed only once.

For example, the semiconductor memory devices according to the first embodiment to the fifth embodiment may be configured such that the current adjustment sequence is performed corresponding to an input of a predetermined command.

OTHERS

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of adjusting operating conditions for a semiconductor memory device, wherein
the semiconductor memory device includes:
a substrate;
a plurality of first conductive layers arranged in a first direction intersecting with a surface of the substrate;
a plurality of first semiconductor layers that extend in the first direction and face the plurality of first conductive layers;
a second semiconductor layer that is separated from the substrate in the first direction and is connected to one end portions of the plurality of first semiconductor layers in the first direction; and
an electric charge accumulating layer disposed between the plurality of first conductive layers and the plurality of first semiconductor layers,
at a predetermined timing of a program operation, a second conductive layer which is one of the plurality of first conductive layers is supplied with a program voltage and a plurality of third conductive layers included in the plurality of first conductive layers are supplied with a write pass voltage smaller than the program voltage, and
the method executes:
a first operation that supplies the second conductive layer and the plurality of third conductive layers with the write pass voltage and supplies a fourth conductive layer which is one of the plurality of first conductive layers with the program voltage; and
a second operation that supplies the second conductive layer with a verify voltage smaller than the write pass voltage, supplies the plurality of third conductive layers with a read pass voltage smaller than the write pass voltage and larger than the verify voltage, and supplies the fourth conductive layer with a voltage smaller than the write pass voltage.

2. The method of adjusting the operation conditions for the semiconductor memory device according to claim 1, wherein
the method repeatedly performs the first operation and the second operation.

3. The method of adjusting the operating conditions for the semiconductor memory device according to claim 1, wherein
assuming that a plurality of conductive layers among the plurality of first conductive layers closest to the second semiconductor layer are a plurality of fifth conductive layers,
at a predetermined timing of the program operation, the plurality of fifth conductive layers are supplied with a voltage smaller than the write pass voltage, and
the fourth conductive layer is one of the plurality of fifth conductive layers.

4. The method of adjusting the operating conditions for the semiconductor memory device according to claim 3, wherein
in the first operation and the second operation, the second semiconductor layer is supplied with a first voltage smaller than the verify voltage.

5. The method of adjusting the operating conditions for the semiconductor memory device according to claim 1, wherein assuming that a plurality of conductive layers among the plurality of first conductive layers farthest from the second semiconductor layer are a plurality of sixth conductive layers, in the first operation, the plurality of sixth conductive layers are supplied with a second voltage smaller than the verify voltage.

6. The method of adjusting the operating conditions for the semiconductor memory device according to claim 1, wherein the semiconductor memory device includes:
a plurality of bit lines connected to the other end portions of the plurality of first semiconductor layers in the first direction, wherein at a predetermined timing of the first operation, a first bit line which is one of the plurality of bit lines and a second bit line which is another one of the plurality of bit lines are supplied with different voltages.

7. The method of adjusting the operating conditions for the semiconductor memory device according to claim 6, wherein the plurality of first conductive layers include a seventh conductive layer closer to the second semiconductor layer than the fourth conductive layer, and at a predetermined timing of the first operation, the seventh conductive layer is supplied with a third voltage with a negative polarity.

8. The method of adjusting the operating conditions for the semiconductor memory device according to claim 1, wherein at a first timing of the first operation,
the second conductive layer is supplied with the write pass voltage,
the fourth conductive layer is supplied with the program voltage, and
an eighth conductive layer which is one of the plurality of first conductive layers is supplied with the write pass voltage, and at a second timing of the first operation,
the second conductive layer is supplied with the write pass voltage,
the fourth conductive layer is supplied with the write pass voltage, and
the eighth conductive layer is supplied with the program voltage.

9. The method of adjusting the operating conditions for the semiconductor memory device according to claim 8, wherein the plurality of first conductive layers include a ninth conductive layer closer to the second semiconductor layer than the fourth conductive layer and the eighth conductive layer, at the first timing, the ninth conductive layer is supplied with a third voltage with a negative polarity, and at the second timing, the ninth conductive layer is supplied with the third voltage.

10. The method of adjusting the operating conditions for the semiconductor memory device according to claim 1, wherein the semiconductor memory device includes a third semiconductor layer that is disposed between the second semiconductor layer and the plurality of first conductive layers and faces the plurality of first semiconductor layer, wherein the second semiconductor layer includes N type impurities.

11. A method of adjusting operating conditions for a semiconductor memory device, wherein the semiconductor memory device includes:
a substrate;
a plurality of first conductive layers arranged in a first direction intersecting with a surface of the substrate;
a plurality of first semiconductor layers that extend in the first direction and face the plurality of first conductive layers;
a second semiconductor layer that is part of the substrate and is connected to one end portions of the plurality of first semiconductor layers in the first direction; and
an electric charge accumulating layer disposed between the plurality of first conductive layers and the plurality of first semiconductor layers, at a predetermined timing of a program operation, a second conductive layer which is one of the plurality of first conductive layers is supplied with a program voltage and a plurality of third conductive layers included in the plurality of first conductive layers are supplied with a write pass voltage smaller than the program voltage, and the method executes:
a first operation that supplies the second conductive layer and the plurality of third conductive layers with the write pass voltage and supplies a fourth conductive layer which is one of the plurality of first conductive layers with the program voltage; and
a second operation that supplies the second conductive layer with a verify voltage smaller than the write pass voltage, supplies the plurality of third conductive layers with a read pass voltage smaller than the write pass voltage and larger than the verify voltage, and supplies the fourth conductive layer with a voltage smaller than the write pass voltage.

12. The method of adjusting the operating conditions for the semiconductor memory device according to claim 11, wherein the method repeatedly performs the first operation and the second operation.

13. The method of adjusting the operating conditions for the semiconductor memory device according to claim 11, wherein assuming that a plurality of conductive layers among the plurality of first conductive layers closest to the second semiconductor layer are a plurality of fifth conductive layers, at a predetermined timing of the program operation, the plurality of fifth conductive layers are supplied with a voltage smaller than the write pass voltage, and the fourth conductive layer is one of the plurality of fifth conductive layers.

14. The method of adjusting the operating conditions for the semiconductor memory device according to claim 13, wherein in the first operation and the second operation, the second semiconductor layer is supplied with a first voltage smaller than the verify voltage.

15. The method of adjusting the operating conditions for the semiconductor memory device according to claim 11, wherein assuming that a plurality of conductive layers among the plurality of first conductive layers farthest from the second semiconductor layer are a plurality of sixth conductive layers, in the first operation, the plurality of sixth conductive layers are supplied with a second voltage smaller than the verify voltage.

16. The method of adjusting the operating conditions for the semiconductor memory device according to claim 11, wherein the semiconductor memory device includes:
a plurality of bit lines connected to the other end portions of the plurality of first semiconductor layers in the first direction, wherein at a predetermined timing of the first operation, a first bit line which is one of the plurality of bit lines and a second bit line which is another one of the plurality of bit lines are supplied with different voltages.

17. The method of adjusting the operating conditions for the semiconductor memory device according to claim 16, wherein the plurality of first conductive layers include a seventh conductive layer closer to the second semiconductor layer than the fourth conductive layer, and at a predetermined timing of the first operation, the seventh conductive layer is supplied with a third voltage with a negative polarity.

18. The method of adjusting the operating conditions for the semiconductor memory device according to claim 11, wherein at a first timing of the first operation,
the second conductive layer is supplied with the write pass voltage,
the fourth conductive layer is supplied with the program voltage, and
an eighth conductive layer which is one of the plurality of first conductive layers is supplied with the write pass voltage, and at a second timing of the first operation,
the second conductive layer is supplied with the write pass voltage,
the fourth conductive layer is supplied with the write pass voltage, and
the eighth conductive layer is supplied with the program voltage.

19. The method of adjusting the operating conditions for the semiconductor memory device according to claim 18, wherein the plurality of first conductive layers include a ninth conductive layer closer to the second semiconductor layer than the fourth conductive layer and the eighth conductive layer, at the first timing, the ninth conductive layer is supplied with a third voltage with a negative polarity, and at the second timing, the ninth conductive layer is supplied with the third voltage.

* * * * *